US011884854B2

(12) United States Patent
Loiudice et al.

(10) Patent No.: US 11,884,854 B2
(45) Date of Patent: Jan. 30, 2024

(54) METHOD FOR PRODUCING AN OXIDE SHELL AROUND NANOCRYSTALS

(71) Applicant: ECOLE POLYTECHNIQUE FEDERALE DE LAUSANNE (EPFL), Lausanne (CH)

(72) Inventors: Anna Loiudice, Sion (CH); Raffaella Buonsanti, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 179 days.

(21) Appl. No.: 17/441,431

(22) PCT Filed: Mar. 27, 2020

(86) PCT No.: PCT/EP2020/058695
§ 371 (c)(1),
(2) Date: Sep. 21, 2021

(87) PCT Pub. No.: WO2020/193751
PCT Pub. Date: Oct. 1, 2020

(65) Prior Publication Data
US 2022/0177777 A1    Jun. 9, 2022

Related U.S. Application Data

(60) Provisional application No. 62/825,125, filed on Mar. 28, 2019.

(51) Int. Cl.
*C09K 11/61* (2006.01)
*C09K 11/02* (2006.01)
(Continued)

(52) U.S. Cl.
CPC .......... *C09K 11/616* (2013.01); *C01F 17/235* (2020.01); *C01G 11/00* (2013.01);
(Continued)

(58) Field of Classification Search
CPC ... C09K 11/883; C09K 11/616; C09K 11/025; C09K 11/00; C01G 1/00; C01G 11/00;
(Continued)

(56) References Cited

U.S. PATENT DOCUMENTS

2009/0315016 A1 * 12/2009 Elam ..................... B82Y 10/00
257/15
2010/0283005 A1    11/2010 Pickett et al.
(Continued)

FOREIGN PATENT DOCUMENTS

CN         107686725 A     2/2018

OTHER PUBLICATIONS

International Search Report from corresponding PCT Application No. PCT/EP2020/058695 dated Aug. 14, 2020.
(Continued)

*Primary Examiner* — Matthew E. Hoban
(74) *Attorney, Agent, or Firm* — Harness Dickey & Pierce P.L.C.

(57) ABSTRACT

The present invention relates to a method for producing core-shell nanocrystals consisting of a metal-containing nanocrystal core and a shell layer comprising at least one metal oxide material having variable shell thicknesses, and use of the core-shell nanocrystals for different applications.

13 Claims, 22 Drawing Sheets

(51) Int. Cl.

| | |
|---|---|
| *C01G 21/06* | (2006.01) |
| *C01F 17/235* | (2020.01) |
| *C01G 11/00* | (2006.01) |
| *C01G 21/00* | (2006.01) |
| *C01G 21/16* | (2006.01) |
| *C09K 11/77* | (2006.01) |
| *C09K 11/88* | (2006.01) |
| *C23C 16/455* | (2006.01) |
| *B82Y 20/00* | (2011.01) |
| *B82Y 30/00* | (2011.01) |
| *B82Y 40/00* | (2011.01) |

(52) U.S. Cl.
CPC ........... *C01G 21/006* (2013.01); *C01G 21/16* (2013.01); *C09K 11/025* (2013.01); *C09K 11/7716* (2013.01); *C09K 11/883* (2013.01); *C23C 16/45527* (2013.01); *B82Y 20/00* (2013.01); *B82Y 30/00* (2013.01); *B82Y 40/00* (2013.01); *C01P 2004/04* (2013.01); *C01P 2004/32* (2013.01); *C01P 2004/64* (2013.01); *C01P 2004/80* (2013.01); *C01P 2006/60* (2013.01)

(58) Field of Classification Search
CPC .. C01G 21/16; C01F 17/235; C23C 16/45527
See application file for complete search history.

(56) References Cited

U.S. PATENT DOCUMENTS

2017/0104089 A1     4/2017   Koezuka et al.
2018/0230376 A1     8/2018   Schmidt et al.

OTHER PUBLICATIONS

Written Opinion from corresponding PCT Application No. PCT/EP2020/058695 dated Aug. 14, 2020.
Ithurria, S., et al., "Colloidal Atomic Layer Deposition (c-ALD) using Self-Limiting Reactions at Nanocrystal Surface Coupled to Phase Transfer between Polar and Nonpolar Media," J. Am. Chem. Soc., 134: 18585-18590 (2012).
Kumar, M.K., et al., "Field Effects in Plasmonic Photocatalyst by Precise SiO2 Thickness Control Using Atomic Layer Deposition," ACS Catalysis, 1(4): 300-308 (2011).
Zhao, Y. & Zhu, K., "Organic-inorganic hybrid lead halide perovskites for optoelectronic and electronic applications," Chem. Soc. Rev., 45: 655-689 (2016).

* cited by examiner

METHOD FOR PRODUCING AN OXIDE SHELL AROUND NANOCRYSTALS

FIELD OF THE INVENTION

The present invention relates to a method for producing core-shell nanocrystals consisting of a metal-containing nanocrystal core and a shell layer comprising at least one metal oxide material having variable shell thicknesses, and use of the core-shell nanocrystals for different applications.

BACKGROUND OF THE INVENTION

Metal oxide core-shell nanoparticles are pivotal for many areas of science, including medicine, biology, optics, electronics, energy storage and catalysis. Most oxide shells are prepared via hydrolysis/condensation reactions, with one representative example being the so-called Stober method where tetraethylortosilicate is used as the precursor for the growth of silica shells. The main drawbacks of the available wet-chemistry approaches are the encapsulation of multiple nanoparticles within the same shell, which results in micron-size powders as the final product, and the poor control over the shell thickness below 5 nm. Yet, thinner oxide layers are interesting when the aim is to manipulate the communication of the core with the external environment rather than to completely isolate it (i.e., charge transfer or diffusion of atomic species across the shell). One must turn to atomic layer deposition (ALD) in gas phase to achieve control and tunability at the atomic scale over conformal oxide layers. However, gas-phase ALD suffers from some limitations such as the difficult control over the amount of precursor, which is dictated by the pressure range covered in the reactor, and the loss of colloidal stability in the case of powder reactors. In addition, gas-phase ALD requires rather expensive equipment, it needs high vacuum and it requires higher temperatures, it can be applied in thin film or powders, though the latter is rarer. In the case of thicker coating (more than 20 nm) silica is the preferred oxide. It can be grown in solution and one of the most common approaches is the Stober method, based on hydrolysis/condensation reactions. This method is carried out in solution but it is difficult to utilize for other oxides such as alumina or titania. One reason why one might want a different oxide is for the tuning of the chemical properties (i.e. silica is not stable in basic environment, instead titania is).

Colloidal ALD (c-ALD) allows to overcome these issues, however its potential has been mostly limited to the synthesis of chalcogenide core-shell nanoparticles. Pioneering work in the field has been carried out by Itthuria et al. (J. Am. Chem. Soc. 2012, 134) with other follow-ups reported in the literature. In these studies, the ALD process starts with the functionalization of the nanocrystalline core surface with inorganic ligands (e.g. $S^{2-}$, $Se^{2-}$, $Sn_2S_6^{4-}$, etc.) followed by the addition of the chalcogenide precursor.

Thus the ability to tune core-shell nanoparticles is desirable for many applications, yet it remains a key synthetic challenge especially when the shell is a metal oxide. Therefore, there is still a need for a reliable method for producing stable core-shell nanoparticles with controlled thickness of shell around the core.

SUMMARY OF THE INVENTION

An aspect of the present invention provides a colloidal atomic layer deposition (c-ALD) method for producing core-shell nanocrystals consisting of a metal-containing nanocrystal core and a shell layer comprising at least one metal oxide material, the method comprising a) providing metal-containing nanocrystal cores selected from the group comprising semiconductors, metals, metal oxides or combinations thereof, wherein the semiconductors are selected from the group comprising CdSe, ZnSe, InP, $Zn_3P_2$, InSe, C-dot, $CsPbX_3$ (wherein X is Br, I, or Cl), or combinations thereof, wherein the metals are selected from the group comprising Ag, Au, Pt, Pd, or combinations thereof and wherein the metal oxides are selected from the group comprising $CeO_2$, ZnO, $TiO_2$, $SiO_2$, or combinations thereof, b) dispersing metal-containing nanocrystal cores in an organic solvent under inert gas to provide a reaction mixture and maintaining the reaction mixture under inert gas atmosphere, c) introducing one or more highly reactive organometallic compounds to the reaction mixture, wherein the one or more highly reactive organometallic compounds are able to produce volatile secondary products during the reaction and are preferably selected from the group comprising trimethyl aluminum, dimethylzinc, tetrakis(dimethylamido)titanium(IV), trymethylindium, trymethylgallium or combinations thereof, d) waiting for sufficient time to allow reaction and then deposition of the one or more highly reactive organometallic compounds on the surface of the metal-containing nanocrystal cores, e) introducing the pure oxygen to the reaction mixture, f) waiting for sufficient time to obtain formation of a metal oxide layer on the surface of the metal-containing nanocrystal cores and thereby growth of a metal oxide shell on the surface of the metal-containing nanocrystal cores, g) sequentially repeating steps c) to f) until an optimal thickness of the metal oxide shell is obtained on the surface of the metal-containing nanocrystal cores;

a) introducing terminating ligands selected from the group comprising fatty acids, long chain amine and phosphine oxides, or combinations thereof, to the reaction mixture to stop the growth of the metal oxide shell, wherein preferably the fatty acids are selected from the group comprising oleic acid, myristic acid, stearic acid, or combinations thereof, and wherein preferably the long chain amine and phosphine oxides are selected from the group comprising dodecylamine, oleylamine, trioctylphosphine, trioctylphospineoxide, or combinations thereof.

Another aspect of the present invention provides a core-shell nanocrystal consisting of a metal-containing nanocrystal core and a shell layer comprising at least one metal oxide material, obtained by the colloidal atomic layer deposition (c-ALD) method of the invention.

Another aspect of the present invention provides a use of the core-shell nanocrystals of the invention as quantum dots or semiconductor nanocrystals.

Another aspect of the present invention provides a quantum dot light emitting diode (QD-LED) comprising the core-shell nanocrystals of the invention.

Another aspect of the present invention provides a photovoltaic device comprising the core-shell nanocrystals of the invention.

Another aspect of the present invention provides a catalytic material comprising the core-shell nanocrystals of the invention.

Another aspect of the present invention provides a biomaterial comprising the core-shell nanocrystals of the invention.

DETAILED DESCRIPTION OF THE INVENTION

Figure 1:
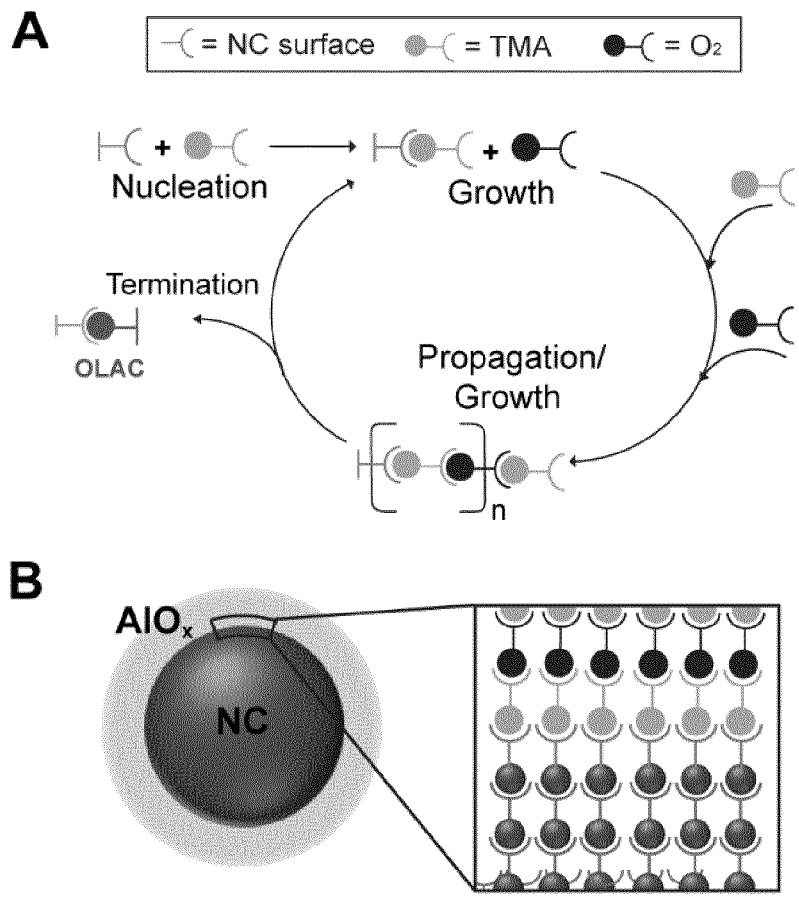
FIG. 1 shows A) Schematic of the c-ALD synthesis and B) sketch of the obtained core-shell NCs.

All publications, patent applications, patents, and other references mentioned herein are incorporated by reference in their entirety. The publications and applications discussed herein are provided solely for their disclosure prior to the filing date of the present application. Nothing herein is to be construed as an admission that the present invention is not entitled to antedate such publication by virtue of prior invention. In addition, the materials, methods, and examples are illustrative only and are not intended to be limiting.

In the case of conflict, the present specification, including definitions, will control. Unless defined otherwise, all technical and scientific terms used herein have the same meaning as is commonly understood by one of skill in art to which the subject matter herein belongs. As used herein, the following definitions are supplied in order to facilitate the understanding of the present invention.

The term "comprise" is generally used in the sense of include, that is to say permitting the presence of one or more features or components. Also as used in the specification and claims, the language "comprising" can include analogous embodiments described in terms of "consisting of" and/or "consisting essentially of".

As used in the specification and claims, the singular form "a", "an" and "the" include plural references unless the context clearly dictates otherwise.

As used in the specification and claims, the term "and/or" used in a phrase such as "A and/or B" herein is intended to include "A and B", "A or B", "A", and "B".

In the context of the present invention, the terms "nanocrystal" and "nanoparticle" can be used interchangeably in embodiments of the invention.

As used in the specification and claims, the term "at least one metal material" intend to include "one metal material", so that a shell layer comprises only layers of one and the same metal material, or more than one metal material (i.e. a plurality of different metal materials), so that a shell layer comprises a plurality of layers, wherein some layers comprise different metal material from the other layers, such as for example a shell layer may comprise one layer of Al$_2$O$_{3-x}$ (where 0<x<3) and another layer of TiO$_{2-x}$ (where 0<x<2) and/or ZnO$_{1-x}$ (where 0<x<1). In the context of the present disclosure, Al$_2$O$_{3-x}$ (where 0<x<3), TiO$_{2-x}$ (where 0<x<2) and ZnO$_{1-x}$ (where 0<x<1) are abbreviated as AlOx, TiOx and ZnOx.

The present invention relates to a colloidal atomic layer deposition (c-ALD) synthesis to grow a metal oxide shell, such as aluminum oxide (AlO$_x$), with tunable thickness around nanocrystal cores of various compositions selected from the group comprising ionic semiconductors (such as CsPbX$_3$, with X=Br, I, Cl), metals (such as Ag), metal oxides (such as CeO$_2$). Compared to gas phase atomic layer deposition (ALD), the c-ALD developed synthesis has the advantage of preserving the colloidal stability of the nanocrystalline core while controlling the shell thickness from 1 nm to 20 nm, preferably 1 nm to 6 nm.

An aspect of the present invention provides a colloidal atomic layer deposition (c-ALD) method for producing core-shell nanocrystals consisting of a metal-containing nanocrystal core and a shell layer comprising at least one metal oxide material, the method comprising a) providing metal-containing nanocrystal cores selected from the group comprising semiconductors, metals, metal oxides or combinations thereof,
    wherein the semiconductors are selected from the group comprising CdSe, ZnSe, InP, Zn$_3$P$_2$, InSe, C-dot, CsPbX$_3$ (wherein X is Br, I, or Cl), or combinations thereof; preferably the semiconductors are selected from the group comprising CdSe, C-dot, CsPbX$_3$ (wherein X is Br, I, or Cl),
    wherein the metals are selected from the group comprising Ag, Au, Pt, Pd, or combinations thereof; preferably the metals are selected from the group comprising Ag, Au, Pt, Pd; more preferably the metal is Ag,
    wherein the metal oxides are selected from the group comprising CeO$_2$, ZnO, TiO$_2$, SiO$_2$, or combinations thereof; preferably the metal oxides are selected from the group comprising CeO$_2$, ZnO, TiO$_2$, SiO$_2$; more preferably the metal oxide is CeO$_2$, b) dispersing metal-containing nanocrystal cores in an organic solvent under inert gas to provide a reaction mixture and maintaining the reaction mixture under inert gas atmosphere, c) introducing one or more highly reactive organometallic compounds to the reaction mixture, wherein the one or more highly reactive organometallic compounds are able to produce volatile secondary products during the reaction and are preferably selected from the group comprising trimethyl aluminum, dimethylzinc, tetrakis (dimethylamido)titanium(IV), trymethylindium, trymethylgallium or combinations thereof, more preferably selected from the group comprising trimethyl aluminum, dimethylzinc, tetrakis(dimethylamido)titanium (IV), trymethylindium, or trymethylgallium, most preferably selected from the group comprising trimethyl aluminum, dimethylzinc, or tetrakis(dimethylamido) titanium(IV), d) waiting for sufficient time to allow reaction and then deposition of the one or more highly reactive organometallic compounds on the surface of the metal-containing nanocrystal cores, e) introducing the pure oxygen to the reaction mixture, f) waiting for sufficient time to obtain formation of a metal oxide layer on the surface of the metal-containing nanocrystal cores and thereby growth of a metal oxide shell on the surface of the metal-containing nanocrystal cores, g) sequentially repeating steps c) to f) until an optimal thickness of the metal oxide shell is obtained on the surface of the metal-containing nanocrystal cores;

h) introducing terminating ligands selected from the group comprising fatty acids, long chain amine and phosphine oxides, or combinations thereof, to the reaction mixture to stop the growth of the metal oxide shell, wherein preferably the fatty acids are selected from the group comprising oleic acid, myristic acid, stearic acid, or combinations thereof, and wherein preferably the long chain amine and phosphine oxides are selected from the group comprising dodecylamine, oleylamine, trioctylphosphine, trioctylphospineoxide, or combinations thereof. In a preferred embodiment, the terminating ligand is oleic acid.

In an embodiment, the method of the invention is conducted as a one-pot reaction, in which the metal-containing nanocrystal cores, the organic solvent, the inert gas, the one or more highly reactive organometallic compounds, the pure oxygen and the terminating ligands are added to a reactor to form the core-shell nanocrystals.

In another embodiment of the method of the invention, the organic solvent is selected from the group comprising saturated aliphatic hydrocarbons selected from the group comprising pentane, hexane, heptane, octane, nonane, decane, undecane, and dodecane; saturated alicyclic hydrocarbons selected from the group comprising cyclohexane and cycloheptane; and aromatic hydrocarbons selected from the group comprising toluene, xylene, trimethylbenzene, ethylbenzene, ethyltoluene, and indene. In a preferred embodiment, the organic solvent is octane.

In another embodiment of the method of the invention, the inert gas is selected from the group comprising argon, nitrogen and helium.

As used in the specification and claims, the term "highly reactive organometallic compounds" refers to compounds containing at least one chemical bond between a carbon atom of an organic molecule and a metal, such as alkaline, alkaline earth, and transition metals. These compounds are typically highly reactive due to the polarized metal-carbon bond and are able to produce volatile secondary products during the reaction. In a preferred embodiment the highly reactive organometallic compounds are in a liquid form. In some embodiments of the method of the invention, the one or more highly reactive organometallic compounds is first diluted/dissolved in the organic solvent before introduction to the reaction mixture. The organic solvent is selected from the group comprising saturated aliphatic hydrocarbons selected from the group comprising pentane, hexane, heptane, octane, nonane, decane, undecane, and dodecane; saturated alicyclic hydrocarbons selected from the group comprising cyclohexane and cycloheptane; and aromatic hydrocarbons selected from the group comprising toluene, xylene, trimethylbenzene, ethylbenzene, ethyltoluene, and indene. In a preferred embodiment, the organic solvent is octane.

In another embodiment of the method of the invention, the one or more highly reactive organometallic compounds are selected from the group comprising trimethyl aluminium, dimethylzinc, tetrakis(dimethylamido)titanium(IV), trymethylindium, trymethylgallium or combinations thereof. In another embodiment of the method of the invention, the one or more highly reactive organometallic compounds are selected from the group comprising trimethyl aluminium, dimethylzinc, tetrakis(dimethylamido)titanium(IV), or trymethylindium, trymethylgallium. In another embodiment of the method of the invention, the one or more highly reactive organometallic compounds are selected from the group comprising trimethyl aluminium, dimethylzinc, or tetrakis(dimethylamido)titanium(IV).

In another embodiment of the method of the invention, the introducing one or more highly reactive organometallic compounds to the reaction mixture is done with an injection rate of from 0.5 to 1.5 ml/hour, preferably 1 ml/hour to avoid precipitation of the metal-containing nanocrystal cores.

In another embodiment of the method of the invention, the time in step d) necessary to allow deposition of the one or more highly reactive organometallic compounds on the surface of the metal-containing nanocrystal cores is at least 5 minutes and maximum 15 minutes. Preferably the time is from 5 to 15 minutes, or 4 to 20 minutes, or 5 to 30 minutes.

In another embodiment of the method of the invention, the time in step f) necessary to obtain formation of a metal oxide layer on the surface of the metal containing nanocrystal cores and thereby growth of a metal oxide shell on the surface of the metal-containing nanocrystal cores is at least 5 minutes and maximum 15 minutes. Preferably the time is from 5 to 15 minutes, or 4 to 20 minutes, or 5 to 30 minutes.

In another embodiment of the method of the invention, the optimal thickness of the metal oxide shell layer is from 1 nm to 20 nm; preferably 1 nm to 6 nm.

The core-shell nanocrystals of the invention can be used in a liquid form for coating of devices, surfaces or other applications where the liquid form is suitable. Thus no recovering is needed from the reaction mixture. The advantage of the reagents/precursors used in the c-ALD method of the invention is that they are volatile and therefore no purification steps are needed. Indeed, the highly reactive organometallic compounds used in the present invention generate only methane or other volatile compounds after reaction and octane is also a volatile solvent.

In another embodiment, the method of the invention further comprising recovering the core-shell nanocrystals from the reaction mixture by precipitation or by evaporation of the solvent. Indeed, it may be necessary to obtain the core-shell nanocrystals of the invention in a powder form, for example to improve density of the metal oxide shell. If the improved density of the oxide shell is desired, annealing at minimum 200° C. and at maximum 500° C. in air can be carried out.

Another aspect of the invention provides core-shell nanocrystals consisting of a metal-containing nanocrystal core and a shell layer comprising at least one metal oxide material, obtained by the method of the invention.

In an embodiment, the core-shell nanocrystal of the invention consists of a metal-containing nanocrystal core and a shell layer comprising at least one metal oxide material, wherein the metal-containing nanocrystal core is selected from the group comprising semiconductors, metals, metal oxides or combinations thereof, wherein the semiconductors are selected from the group comprising CdSe, ZnSe, InP, $Zn_3P_2$, InSe, C-dot, $CsPbX_3$ (wherein X is Br, I, or Cl), or combinations thereof, preferably the semiconductors are selected from the group comprising CdSe, C-dot, $CsPbX_3$ (wherein X is Br, I, or Cl), wherein the metals are selected from the group comprising Ag, Au, Pt, Pd, or combinations thereof; preferably the metals are selected from the group comprising Ag, Au, Pt, Pd; more preferably the metal is Ag, wherein the metal oxides are selected from the group comprising $CeO_2$, ZnO, $TiO_2$, $SiO_2$, or combinations thereof; preferably the metal oxides are selected from the group comprising $CeO_2$, ZnO, $TiO_2$, $SiO_2$; more preferably the metal oxide is $CeO_2$, wherein the at least one metal oxide material is selected from the group comprising $Al_2O_{3-x}$ (where $0<x<3$), $TiO_{2-x}$ (where $0<x<2$), $ZnO_{1-x}$ (where $0<x<1$).

and wherein a thickness of the shell layer comprising the at least one metal oxide material is from 1 nm to 20 nm; preferably 1 nm to 6 nm.

The core-shell nanocrystals of the invention is a hybrid material platform wherein an oxide shell with tunable thickness allows to stabilize sensitive cores and to study both chemical transformations and electronic interactions occurring at the nanoscale. As one example of the opportunities offered by the growth of a thin oxide shell, the anion exchange reaction in the $CsPbX_3$ perovskites nanocrystals was performed by in situ X-ray diffraction, which had been impeded so far by the instability of this class of materials and by the fast exchange kinetics. As a second example a careful distance-dependent studies on the transfer of excitonic energy in semiconductor NC films was demonstrated. The core-shell NCs of the invention allows for example to observe energy transfer in a system where it was previously excluded, specifically between $CsPbBr_3$ NCs and CdSe NPLs.

Figure 2:
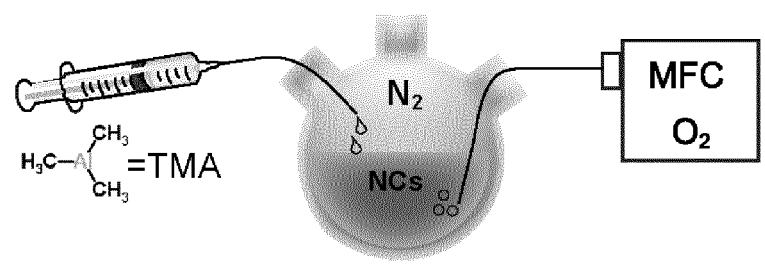
FIG. 2 shows sketch of the c-ALD synthesis set-up.

In an embodiment, the optimal amount of trimethyl aluminium (TMA) diluted in octane is added drop-wise to nanocrystals (NCs) solution; after a sufficient reaction time (such as 5 minutes), $O_2$ gas is introduced followed by other waiting time (such as 5 minutes). These steps constitute one cycle, which is then repeated multiple times to allow a layer-by-layer deposition of metal oxide (such as $AlO_x$). It was observed that after a certain number of cycles (typically 8-10 cycles) the as-synthesized core-shell nanocrystals (NCs) would lose their colloidal stability. In order to prevent this issue, when this stage is reached, OLAC is added in place of the $O_2$ to prevent the formation of any precipitate. The whole colloidal atomic layer deposition (c-ALD) method is illustrated in FIG. 1 and FIG. 2. The repetition of sequential steps multiple times is adopted to precisely control the thickness of the metal oxide shell resulting in a core-shell nanocrystal (NC) structure. The generality of the proposed approach is demonstrated by growing the $AlO_x$ shell on various NC cores in terms of composition and intrinsic properties. These NC cores have distinctive characteristics that combined all together helped to elucidate different aspects of the developed c-ALD synthesis.

Figure 3:
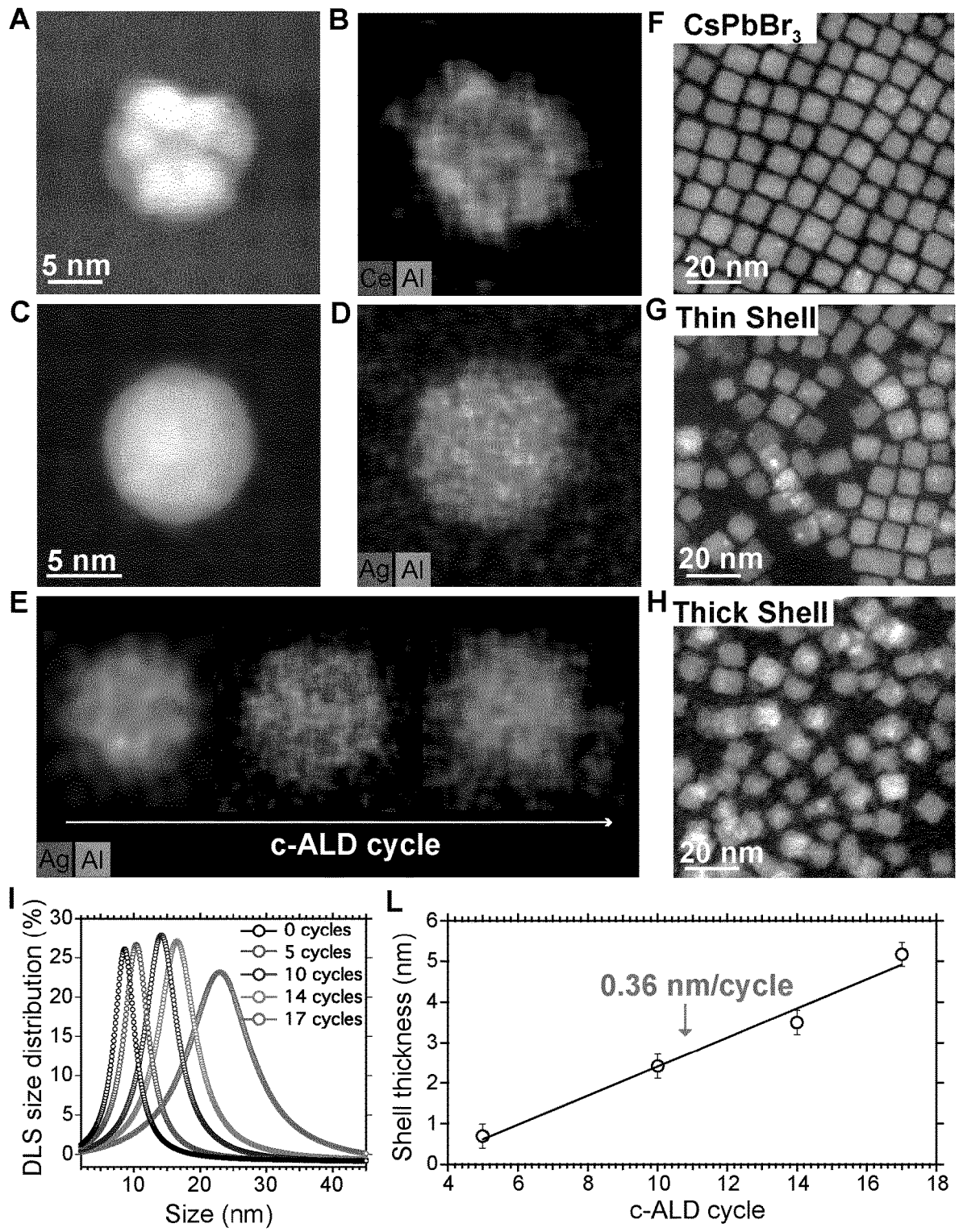
FIG. 3 shows HAADF-STEM images and corresponding EDX coloured maps of A,B) $CeO_2$@$AlO_x$ and C,D) Ag@$AlO_x$ NCs; E) EDX maps of Ag@$AlO_x$ NCs obtained at different c-ALD cycles. F,G,H) HAAFD-STEM images of $CsPbBr_3$@AlOx NCs without any shell, with thin (8 cycles) and thick (17 cycles) $AlO_x$ shell respectively; I) DLS size distribution of $CsPbBr_3$@$AlO_x$ NCs obtained by performing 0, 5, 10, 14, and 17 c-ALD cycles; L) The calculated shell thickness estimated by DLS measurements as a function of c-ALD cycles fitted with a linear curve (black line). From the slope of the fitted curve a growth rate of 0.36 nm/cycle is estimated.
Figure 4:
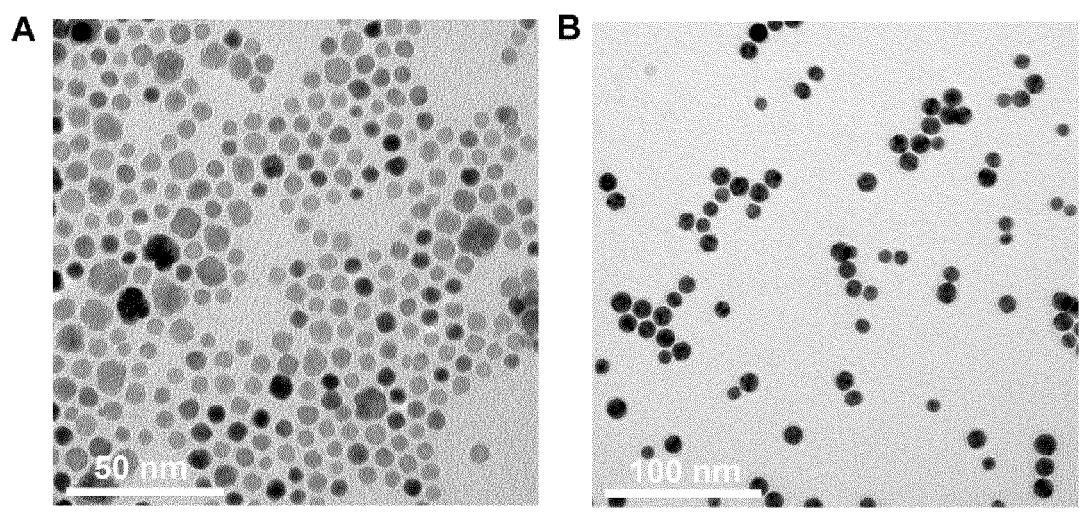
FIG. 4 shows low magnification TEM images of $CeO_2$@$AlO_x$ and Ag@$AlO_x$ core-shell NCs.
Figure 5:
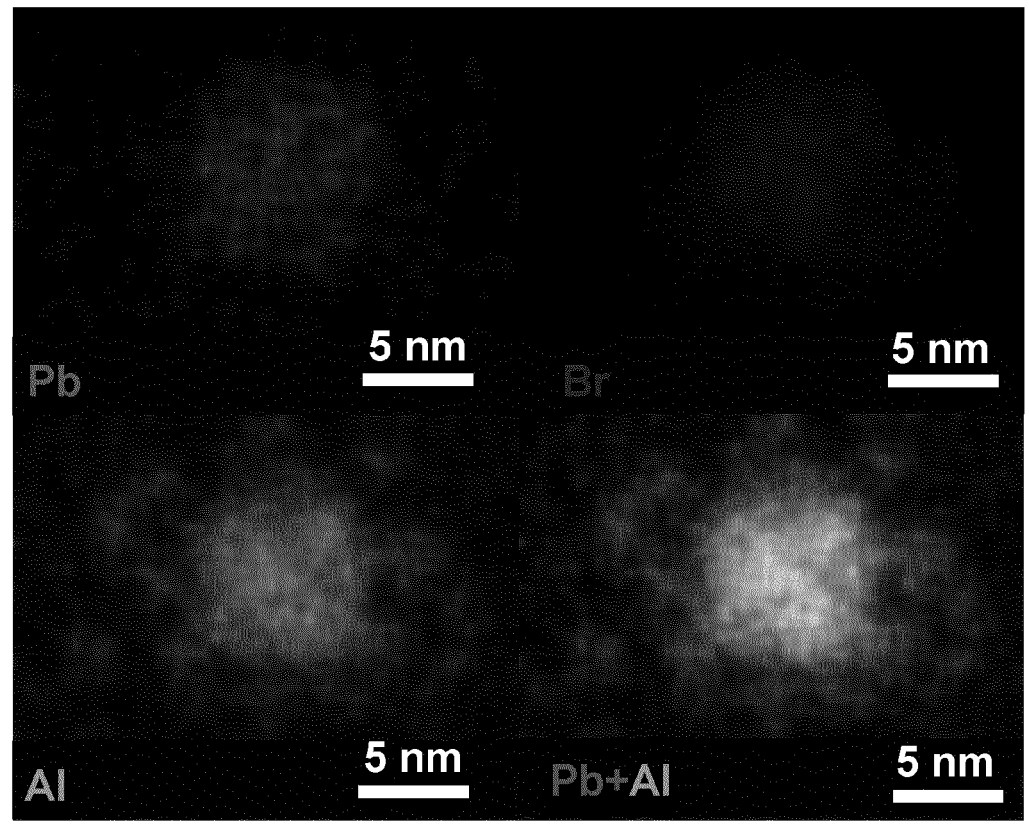
FIG. 5 shows EDX maps of the $CsPbBr_3$@$AlO_x$ thick shell and $CsPbI_3$@$AlO_x$ with respective spectra showing that the Br signal overlaps with Al. Despite Br and Al peaks overlap, from the EDX maps the AlOx shell could be clearly revealed and a shell size thickness of around 5.5 nm could be measured.
Figure 5:
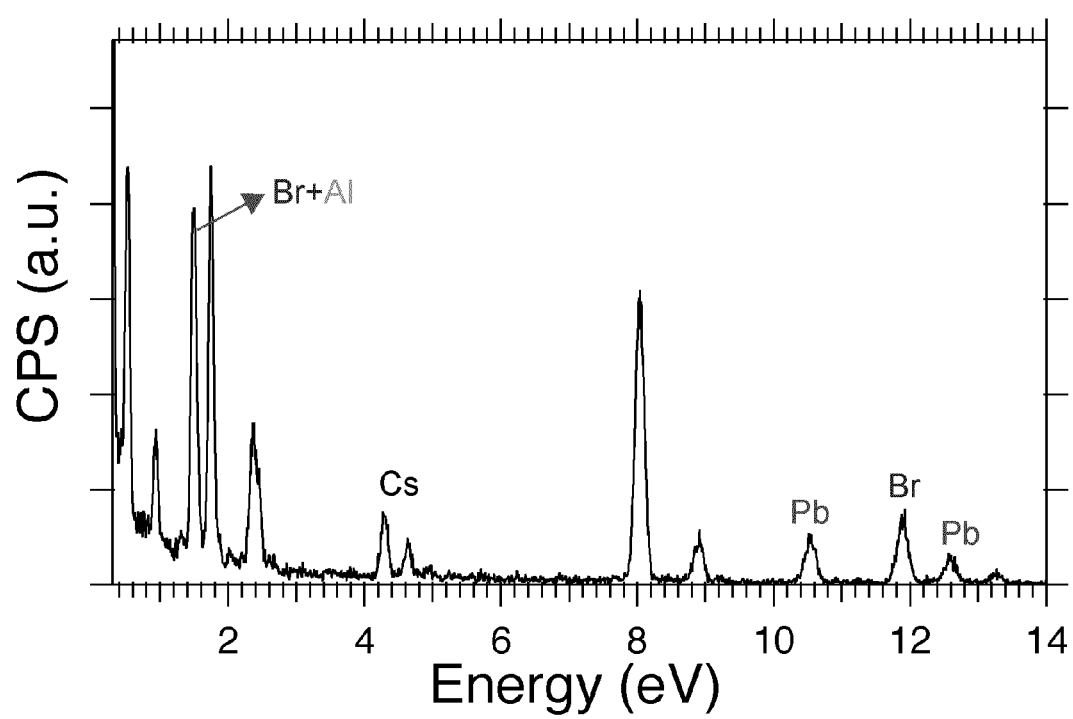

FIG. 3 gives an overview on the synthesized core-shell NCs with different compositions (i.e., $CsPbBr_3@AlO_x$, $CeO_2@AlO_x$, $Ag@AlO_x$ NCs, where x is <1.5) characterized by electron microscopy and DLS. The HAADF-STEM images with the corresponding EDX maps in FIG. 3A-E and the low magnification TEM images in FIG. 4 evidence the preservation of the size and shape of the inorganic core which is surrounded by a lower density alumina shell whose thickness increases with the number of cycles (FIG. 3E). The presence of the $AlO_x$ shell around each single NC core is further evidenced by the strong contrast between the cubic assemblies of the as-synthesized $CsPbBr_3$ NCs on the TEM grid and the highly disordered one for the $CsPbBr_3@AlO_x$ core-shell NCs (FIG. 3F-H). For the $CsPbBr_3$ NCs, characterization EDX mapping cannot provide clear information regarding the presence of the Al in the shell because of the overlap between Br and Al peak in the spectrum (FIG. 5). Thanks to the preservation of colloidal stability of the core-shell NCs, DLS was used to estimate the $AlO_x$ shell thickness vs. the number of cycles (FIG. 3I,L) and allowed to determine the overall growth rate on the NCs. The results show a fine-tuning of the shell thickness ranging from 1 nm to 6 nm and an estimated growth rate during the c-ALD of around 0.36 nm/cycle. The average bond length Al—O—$CH_3$ is around 0.30±0.11 nm (min=0.29 nm and max=0.38 nm based on a CSD search comprising 2892 structures) thus approximately corresponds to the growth rate measured in the system of the present disclosure. The similarity between the measured $AlO_x$ growth rate and the estimated bond length suggests that each cycle correspond to the growth of a single layer around the NC core.

Figure 6:
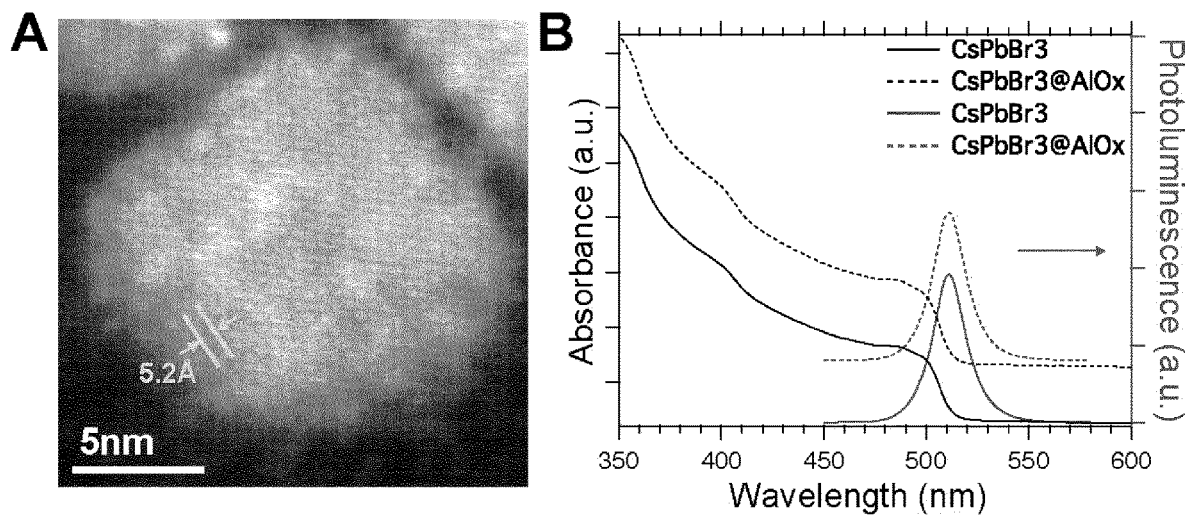
FIG. 6 shows A) HR-STEM image of a single $CsPbBr_3$@$AlO_x$ NC showing that the lattice parameters are retained after the c-ALD process; B) UV-Vis absorption and photoluminescence spectra of uncoated $CsPbBr_3$ NCs (continuous line) and $CsPbBr_3$@$AlO_x$ NCs (dot lines) (the spectra are offset for clarity).
Figure 7:
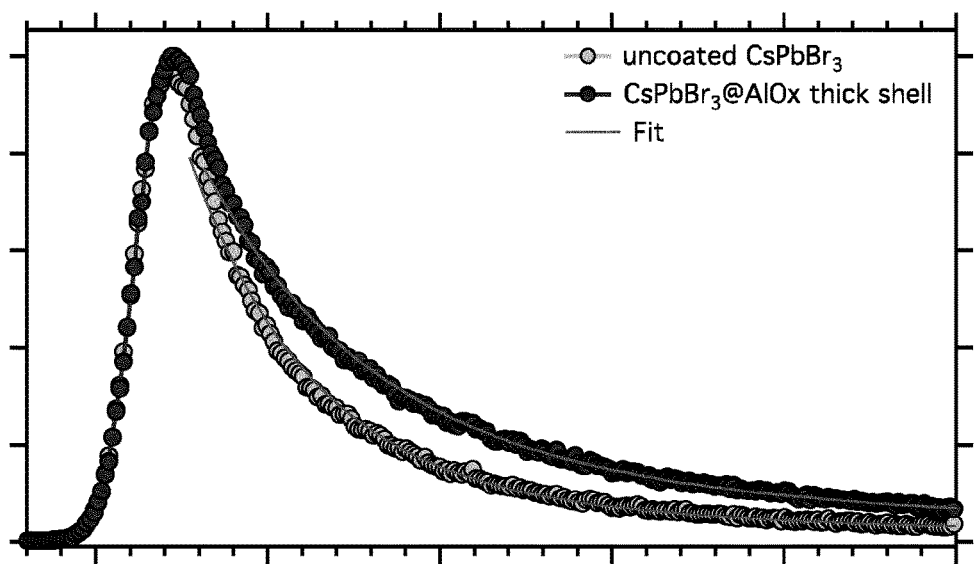
FIG. 7 shows time resolved photoluminescence decays of uncoated $CsPbBr_3$ and $CsPbBr_3$@$AlO_x$ thick shell with the corresponding fit (red lines). See Table 2 for fit parameters.
Figure 8:
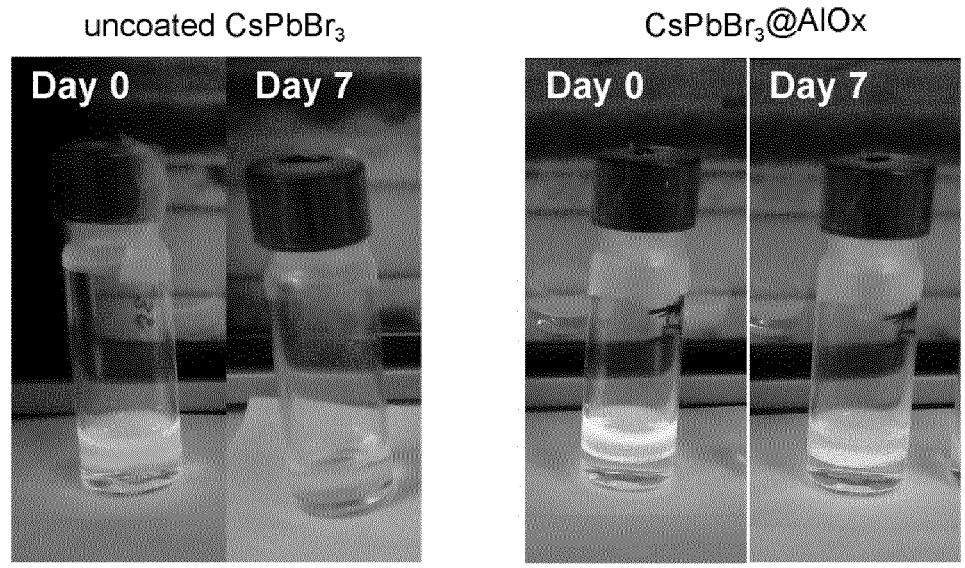
FIG. 8 shows photos of the uncoated $CsPbBr_3$ (left) and $CsPbBr_3$@$AlO_x$ (right) solutions deposited on water showing that the $AlO_x$ shell confers stability against water.

The optical properties of the $CsPbBr_3$ NC cores were studied to assess the preservation of their structure and composition (FIG. 6). The $AlO_x$ was found to even improve the stability and the photoluminescence quantum yield (QY) of the final $CsPbBr_3@AlO_x$ NCs which is almost doubled compared to the uncoated counterpart, suggesting that surface shallow trap passivation occurs during the first c-ALD cycle, also evident by the increased lifetime (FIGS. 7, 8 and Tables 1 and 2). The changes of QY with the amount of TMA added in the solution were used to calibrate the optimal amount of TMA to be added in each c-ALD cycle (FIG. 9, 10 for details regarding the optimization process by tuning injection time, waiting time, temperature). Upon addition of TMA (FIG. 9), the QY increases until a certain amount of TMA is added; after reaching a maximum, the QY reaches a plateau before starting to decrease. The initial increase is attributed to surface trap passivation; when the TMA starts to intercalate between the ligands and the $CsPbX_3$ NCs surface, new trap states are introduced thus causing a decrease in the QY. A similar behaviour was observed for different composition $CsPbX_3$ NCs. The error bars were calculated over 3 measurements on the same sample. The amount of TMA needed to maximize the QY was considered as the optimal amount to add each cycle during the c-ALD so to preserve the maximum QY in the final $CsPbX_3@AlOx$ core shell NCs.

TABLE 1

Figure 10:
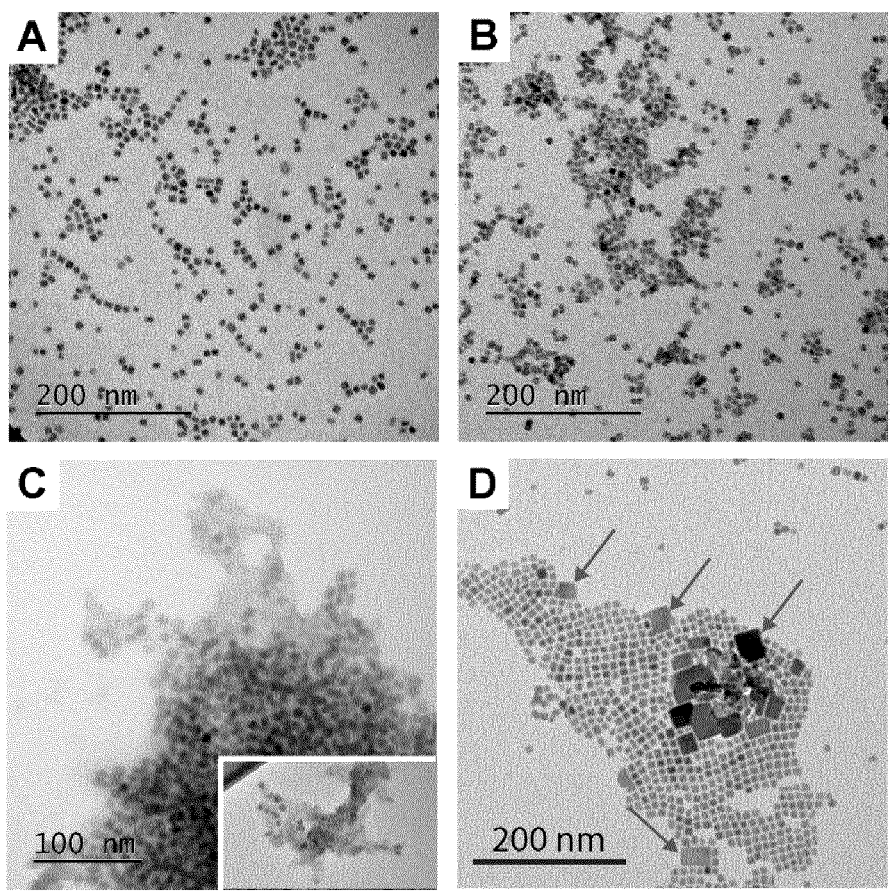
FIG. 10 shows TEM images of $CsPbBr_3$@$AlO_x$ obtained at different c-ALD conditions by keeping the number of cycles constant (8 cycles): A) standard procedure (one cycle: 0.1 μmol of TMA, injection rate 1 ml/h; waiting time=5 min; 1 μmol of $O_2$; 5 min waiting time; room temperature), B) only TMA is added, C) fast TMA injection (1 ml/min) or waiting time=0, D) higher temperature (35° C.).

Percentage QY in solution for the samples showed in FIG. 10.

| Sample name | QY (%) |
| --- | --- |
| as-prepared | 46.2 |
| only TMA - 1 cycle | 71.3 |
| A - standard | 75.3 |
| B - only TMA | 40.6 |
| C - fast injection | * |
| D - 35° C. | 90.9 |

*For sample C it was not possible to measure the stability resulting in a QY because the samples lost colloidal precipitate.

The TEM images in FIG. 10 show that if no $O_2$ is added during the c-ALD process the NCs start to aggregate upon addition of TMA and the final product is a precipitate containing aggregated NCs. If the TMA is added too quickly (<1 ml/h) or the waiting time between one-step and the other is too small (<5 min), the $AlO_x$ will growth separately from the NCs (see inset), resulting in a precipitate. Finally if the standard conditions are used with a higher temperature of 35° C. (D), despite the final product will result in the highest QY (see Table 1), some bigger $CsPbBr_3$ NCs are observed (indicated by the red arrows), suggesting that for $CsPbX_3$ NCs the optimal conditions are the one obtained at room temperature.

TABLE 2

Fitting parameters for CsPbBr$_3$ and CsPbBr$_3$@AlO$_x$ NCs from TRPL decays in FIG. 7. The decay traces were fit with a double-exponential equation as given by dA(t) = A$_1$ exp(-x/τ$_1$) + A$_2$ exp(-x/τ$_2$). A 15% error on the lifetime is typical for this type of analysis. τ$_{avg}$ is a lifetime average weighted by the amplitude A$_1$ and A$_2$.

| Sample name | τ$_1$ (ns) | A$_1$ | τ$_2$ (ns) | A$_2$ | τ$_{avg}$ (ns) |
|---|---|---|---|---|---|
| CsPbBr$_3$ NCs | 3.55 | 0.23 | 17.20 | 1.10*10$^{-3}$ | 3.61 |
| CsPbBr$_3$@AlO$_x$ NCs | 4.82 | 0.58 | 20.61 | 1.09*10$^{-1}$ | 7.35 |

Figure 11:
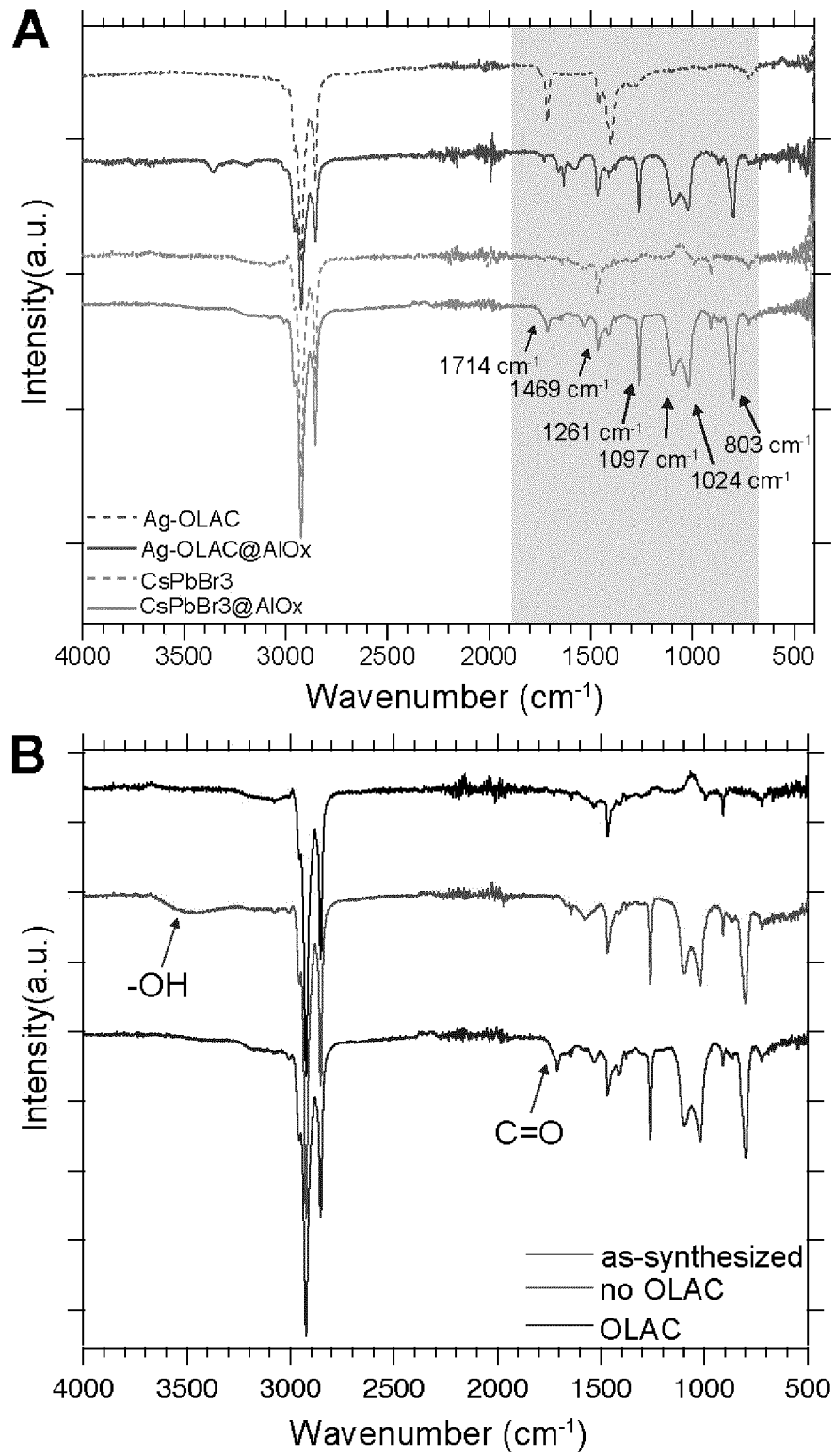
FIG. 11 shows A) FTIR spectra of Ag—OLAC@$AlO_x$ and $CsPbBr_3$@$AlO_x$ NCs. The gray area evidences the features corresponding to the $AlO_x$ shell; B) FTIR spectra of as-synthesized $CsPbBr_3$ NCs (black), $CsPbBr_3$@$AlO_x$ after 8 cycles (red), $CsPbBr_3$@$AlO_x$ after 8 cycles with OLAC termination (blue).
Figure 12:
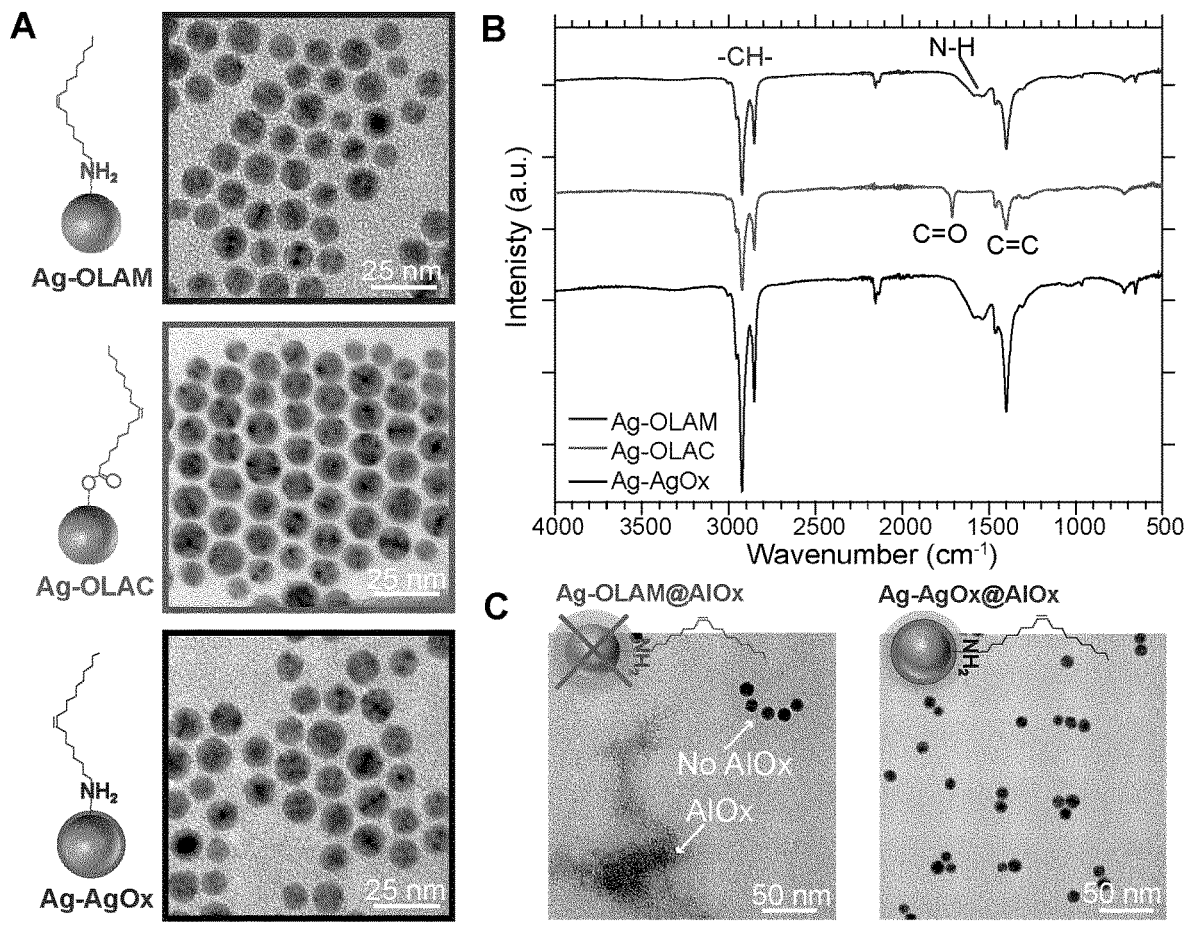
FIG. 12 shows A) TEM images of the Ag NCs with different surface chemistry along with a representative sketch: Ag—OLAM (blue), Ag—OLAC (red) and Ag—AgO (black); B) FTIR spectra of the samples in A); C) TEM images of the obtained Ag—OLAM@$AlO_x$ (left) and Ag—$AgO_x$@$AlO_x$ (right) NCs.
Figure 13:
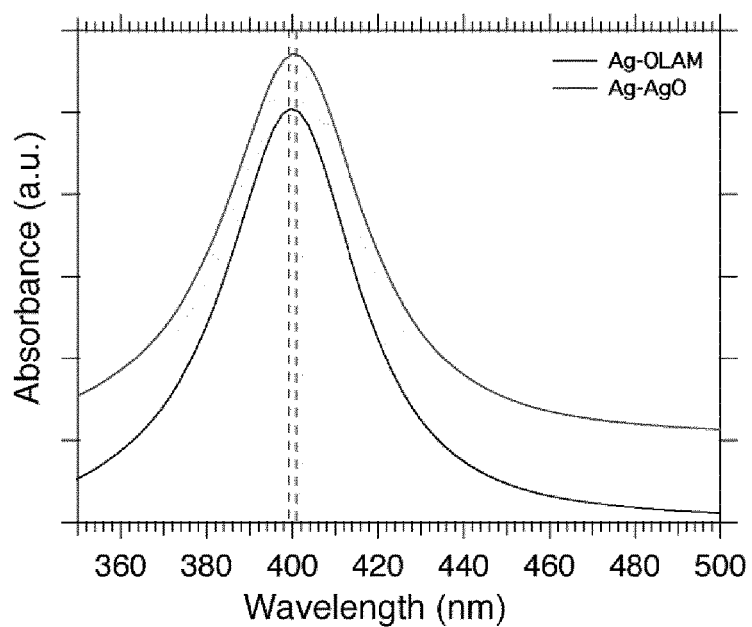
FIG. 13 shows UV-Vis absorption spectra of Ag—OLAM and Ag—AgOx NCs. The Ag plasmonic peak is slightly red-shifted proving the presence of a very thin AgO shell in Ag—AgOx NCs.
Figure 14:
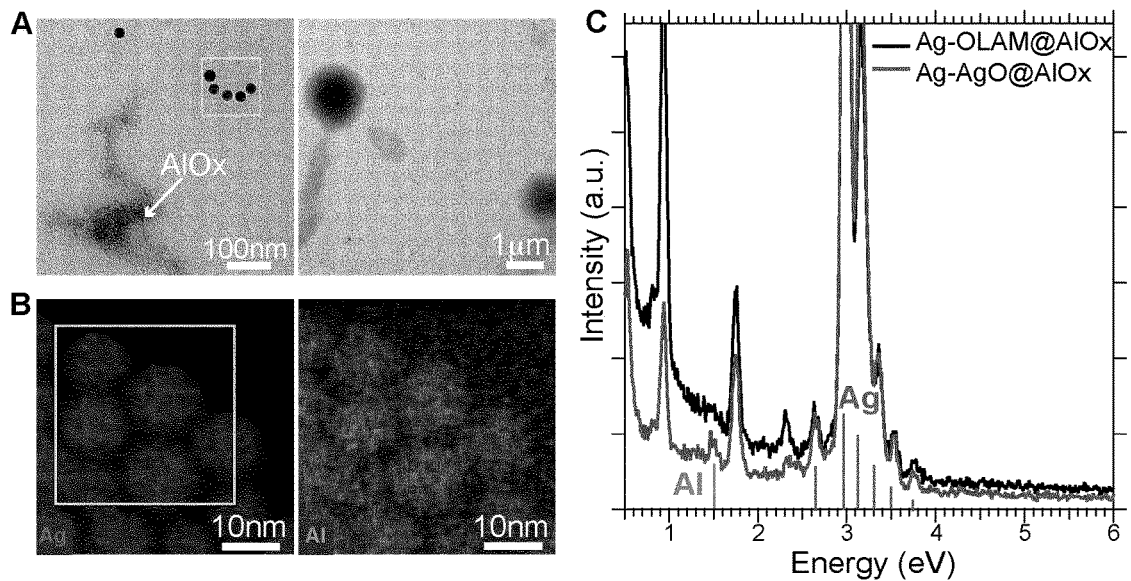
FIG. 14 shows A) TEM images of Ag—OLAM@$AlO_x$ NCs; B) EDX maps of Ag—$AgO_x$@$AlO_x$ NCs; C) representative EDX spectra acquired on Ag—OLAM@$AlO_x$ and Ag—$AgO_x$@$AlO_x$ NCs area like the yellow areas in A and B.

FTIR analysis was performed on the core-shell NCs to characterize the AlO$_x$ structure (FIG. 11). C—H vibrational peaks corresponding to the NC native ligands are still present after the c-ALD, suggesting that the ligands are not removed during the c-ALD process but are rather trapped in the AlO$_x$ shell. Instead, the new features at lower wavenumbers were associated with the presence of an amorphous AlO$_x$ shell. The FTIR shows that the organic ligands are still present after the c-ALD. At the same time, oxygen sites (or more rarely other chemical groups) are required to initiate the ALD by reacting with the TMA. To elucidate the role played by the ligands functionalizing the NC core during the nucleation and growth of the AlO$_x$ shell, the Ag@AlO$_x$ NCs were chosen as the model system because of their robustness and versatile surface chemistry compared to the CsPbX$_3$ and the CeO$_2$ NCs. Moreover, the metallic nature of the Ag NCs allows to study the role of surface oxidation considering that Ag is relatively easy to oxidize. Starting from the as-synthesized Ag NCs that have OLAM as ligands (Ag—OLAM NCs), Ag NCs functionalized with OLAC (Ag—OLAC NCs) were obtained by performing a mild ligand exchange. Instead, Ag NCs with an oxidized surface (Ag—AgO$_x$ NCs) were obtained by flowing pure O$_2$ gas in the Ag—OLAM NC solution. The UV-Vis absorption spectra (FIG. 13) evidenced a slight red shift in the plasmon peak consistent with the formation of a thin oxide shell around the Ag—OLAM NCs. FIG. 12A,B shows the corresponding TEM images and FTIR spectra of the Ag NCs with the three different surface chemistry. The peaks at 1714 cm$^{-1}$, which is characteristic of the C═O stretching, and 1405 cm$^{-1}$, which corresponds to the C═C stretching, evidence the monodentate binding of OLAC on the Ag NC surface. Ag—OLAM NCs and Ag—AgO$_x$ NCs possess the IR signature typical of OLAM functionalization. An equal number of c-ALD cycles (8 cycles) was performed on these Ag NCs. FIG. 12C shows that when c-ALD is performed on Ag—OLAM NCs the AlO$_x$ nucleates in solution heterogeneously, thus separated from the Ag NCs. On the contrary, the AlO$_x$ shell grows on both Ag—OLAC and Ag—AgO NCs surface. These results demonstrate that oxygen, whether on the surface of the NCs or in a monodentate ligand like OLAC, initiates the c-ALD by reacting with the TMA during the first cycle (FIG. 14). Furthermore, FIG. 11 shows that the C═O stretch almost disappears in the Ag—OLAC@AlO$_x$ NCs, which points to the breaking of the double bond following the reaction with the TMA.

FIG. 11A compares the FTIR spectra on both Ag NCs and CsPbBr$_3$ NCs before and after c-ALD. It is evident that the —CH— vibrational stretching of the native ligands on the NCs are still present after the c-ALD, confirming that they are not removed. Moreover new features appear in the region between 700 and 1700 cm$^{-1}$ (evidenced in gray) that could be only assigned to the alumina matrix formed on the synthesized core-shell NCs. The peak at ≈800-900 cm$^{-1}$ is assigned to the Al—O absorbance phonon. The most prominent features were observed at 1024, 1097, and 1261 cm$^{-1}$. The group of S. M. George studied in-situ, by means of FTIR spectroscopy, the mechanism of Al$_2$O$_3$ atomic layer deposition process with TMA and ozone as precursors. It has been observed that during the Al$_2$O$_3$ formation the AlCH$_3$* species upon addition of ozone were converted into AlOCH$_3$* (methoxy), Al(OCHO)* (formate), Al(OCOOH) *(carbonate) and Al(OH) (hydroxyl) species. The process was performed at various temperatures showing that a low temperature process would results in residual of the listed species. In particular the peak at 1261 cm$^{-1}$ observed in our spectra could be assigned to the symmetric Al—CH$_3$ deformation mode. Instead the peaks at 1024 and 1097 cm$^{-1}$ could be assigned to the C—O symmetric vibrations of the carbonate species.

There are also smaller new features observed at 1469 and 1714 cm$^{-1}$. The feature at 1469 cm$^{-1}$ corresponds to the asymmetric CH$_3$ deformation mode of the methoxy species, instead the feature at 1714 cm$^{-1}$ is attributed to the OCO stretching vibration of the carbonate species. At the same time, in our case, this last feature could also derive from the oleic acid present both natively on the NCs or from the one added during the alumina growth to retain the colloidal stability as described in the main manuscript. FIG. 11B compares the FTIR spectra of as-synthesized CsPbBr$_3$ NCs with the one after shell growth with and without OLAC termination. It could be noticed that when no OLAC is added a broad peak at 3500 cm$^{-1}$ characteristic of the —OH vibration is present. On the contrary when OLAC termination is added with the same moles respect to the TMA used in one cycle, the —OH feature is not visible and a little peak at 1714 cm$^{-1}$ is visible that could be assigned to the C═O stretch of monodentate OLAC bounded to the aluminum of the AlO$_x$ shell.

The method of the present invention is useful for coating sensitive nanocrystal cores, namely nanocrystal cores that are highly sensitive to polar environment (i.e. water or alcohols) such as perovskite nanocrystals.

Future engineering of the NC ligands with oxygen-rich groups, such as diols or bi-carboxylic acids, would be interesting to further advance or generalize the developed c-ALD method of the present invention.

The main advantages of the c-ALD method of the invention is that this is a solution-based method to grow a metal oxide shell with tunable thickness on the surface of nanocrystal core, where a highly reactive and cleanly decomposing precursor of the metal oxide is reacted directly with oxygen gas. The method is carried out at room temperature and it is completed within a few hours. The final core-shell nanocrystals stay soluble in solution (the core-shell nanocrystals are dispersed in the solution) or can be dried and used as powders, depending on the desired application.

As one example of the opportunities offered by the growth of a thin oxide shell, the anion exchange reaction in the CsPbX$_3$ perovskites nanocrystals was studied by in-situ X-ray diffraction, a study impeded so far by the instability of these class of materials and by the fast exchange kinetics. Indeed, the advantage of the as-synthesized metal oxide shell, such as alumina shell, was demonstrated by studying nanoscale chemical transformations by focusing on the anion exchange reaction in CsPbX$_3$ nanocrystals (NCs). To date, remarkable studies on ion-exchange in NCs have been performed, mostly focusing on cation exchange (i.e., CdSe to Ag$_2$Se, CdS to PbS NCs, PbS to PbS core-shell CdS and Cu$_{2-x}$S to CuInS$_2$). Only recently, with the booming of perovskites in solar cells and lighting applications, anion exchange reactions have attracted increasing interest in the chemistry community. The facile and fast anion exchange occurring in both NCs and bulk perovskites (i.e. $CsPbBr_3$ to $CsPb(Br_yCl_{1-y})_3$ or $CsPb(Br_yI_{1-y})_3$) plays an important role in photostability, anomalous hysteresis and light induced segregation. Despite the tremendous interest in understanding such phenomena, the ion diffusion mechanism in perovskite is still largely unknown. Because of the fast anion exchange kinetics (completed at the time scale of seconds), the few studies conducted so far have used optical probes, which provide only indirect proofs of structural changes. In the present disclosure, thanks to the $AlO_x$ shell around the $CsPbX_3$ NCs, the anion exchange reaction is slowed down by an order of magnitude and in-situ X-ray diffraction (XRD) studies could be performed. The temporal evolution of the NC structure during the reaction reveals anomalous alloy properties of the halide perovskites compared to conventional semiconductors, in agreement with a recent theoretical study.

As it is possible to grow a tunable metal oxide shell on NCs with different composition as long as oxygen atoms are present on their surface, it is also interesting to explore the new opportunities open by the colloidal atomic layer deposition (c-ALD) method of the invention to study the communication of the inner core with its surroundings. Solid-state transformations via diffusion at the nanoscale are difficult to investigate especially when the kinetics are too fast to allow structural characterization. The anion exchange reaction in $CsPbX_3$ NCs is of particular interest for the present work. Yet, because of the ion exchange occurring within seconds, only optical probes have been used so far.

To closely monitor the structural change occurring during the anion-exchange, $CsPbX_3$ NCs should mix rapidly and reproducibly to ensure a homogeneous environment during the reaction while allowing the X-rays to capture structural information. These requirements were fulfilled by building a home-made set-up where two NC solutions of different composition react in a capillary (see Examples and FIG. 15 for details). In one embodiment, the solution of the $CsPbX_3@AlO_x$ NCs with different shell thicknesses and composition, all in anhydrous octane, were simultaneously injected through a mixing frit placed at the entrance of the reaction chamber (i.e., the capillary) in which the two $CsPbX_3$ NCs have a few sub-milliseconds to mix. This time is shorter than the time needed for the exchange to come to completion, which varies from seconds to tens of minutes depending on the investigated NCs (composition and w/o shell) as discussed later. After the injection, the structural changes occurring during the exchange were monitored in real time by acquiring XRD patterns every 2.5 s. The combination of sub-millisecond mixing time, the millisecond acquisition time permitted by synchrotron radiation, the fact that the $AlO_x$ shell slows down the reaction kinetics and the high resolution data with a high signal-to-noise ratio, enabled to follow the structural evolution of the $CsPbX_3$ NCs during the anion exchange reaction.

Figure 16:
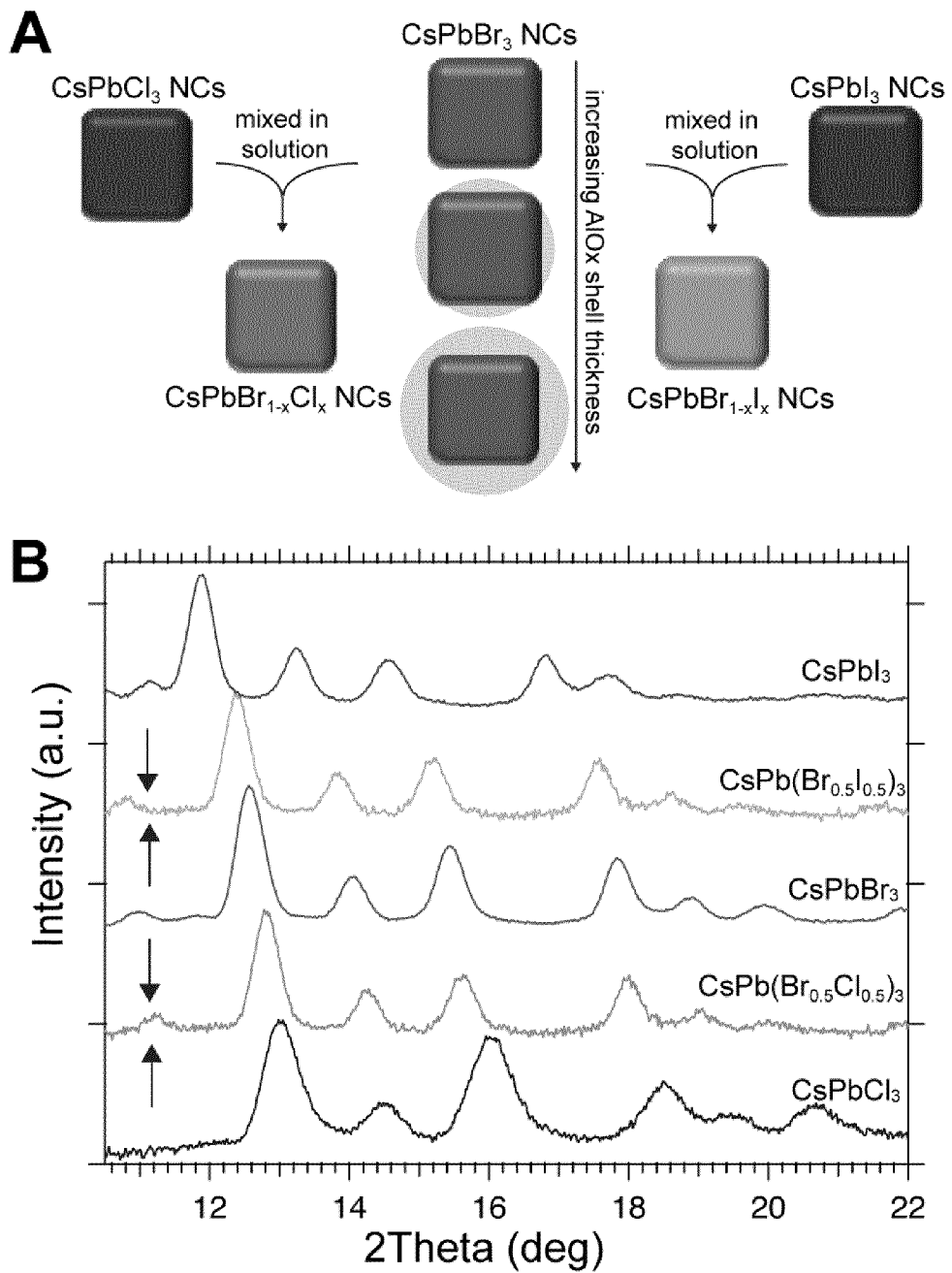
FIG. 16 shows A) Schematics of the anion exchange reactions investigated during the in-situ X-ray diffraction experiments; B) XRD spectra of the as-synthesized $CsPbX_3$ NCs used in the synchrotron experiments together with the XRD spectra of the final products: $CsPb(Br_{0.5}I_{0.5})_3$ and $CsPb(Br_{0.5}Cl_{0.5})_3$ NCs.
Figure 17:
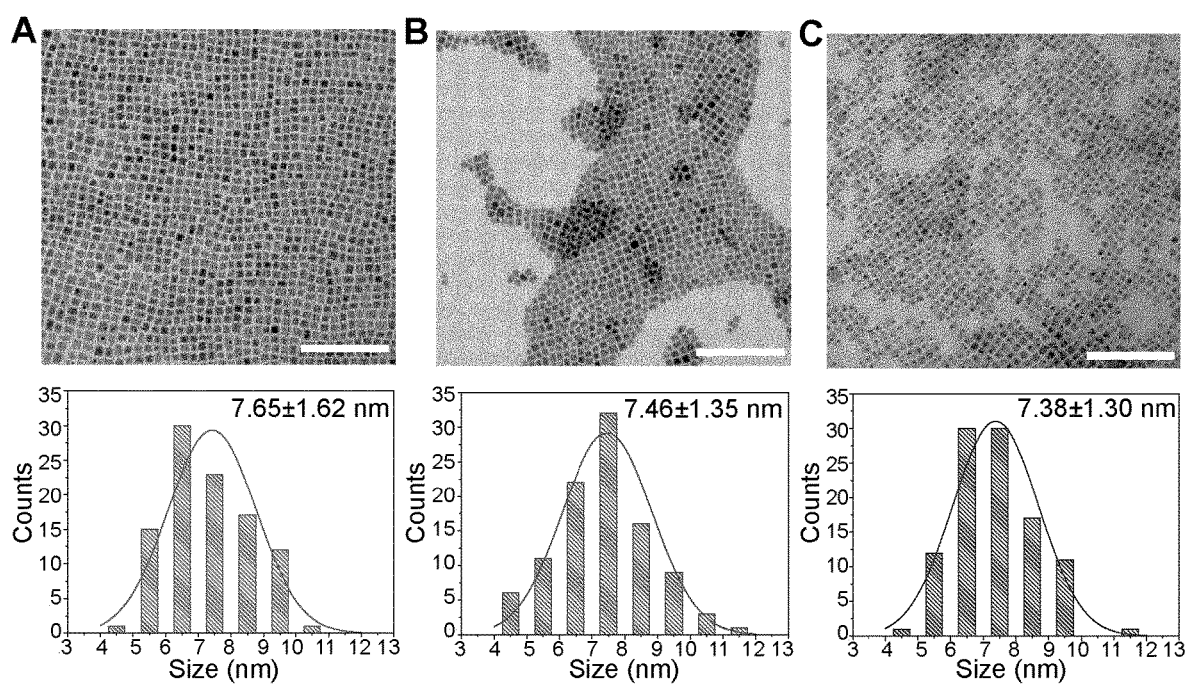
FIG. 17 shows TEM images with size histogram of A) $CsPbBr_3$, B) $CsPbI_3$, and C) $CsPbCl_3$ used for the anion exchange experiments.

FIG. 16A summarizes schematically the in-situ experiments that were performed. Specifically, $CsPbBr_3@AlO_x$ NCs with two different $AlO_x$ shell thickness (FIG. 3F-H) constitute one of the reagents and they will be referred to as Br/no-shell, Br/shell1 and Br/shell2, respectively. As the second reagent, $CsPbCl_3$ NCs, $CsPbI_3$ NCs and $CsPbI_3@AlO_x$ shell1 NCs (named Cl/no-shell, I/no-shell and I/shell1) were selected. The XRD patterns of the uncoated $CsPbX_3$ NCs used in this work together with the XRD pattern obtained for the final exchanged product ($CsPb(X_{1-y}Br_y)_3$ NCs with $X=I$ or Cl) are reported in FIG. 16B, which evidence that the different composition $CsPbX_3$ NCs are characterized by distinguished diffraction features. The corresponding core—shell NCs have similar XRD patterns (data not shown). The initial concentrations of the NCs in the mixture were adjusted so that the final product will result in a mixed halide with 1:1 ratio. FIG. 17 shows that all the NCs used during the in-situ experiment have an average edge size of 7.5 nm, so to exclude that any broadening of the XRD peaks is due to inhomogeneity in the NC size.

Figure 18:
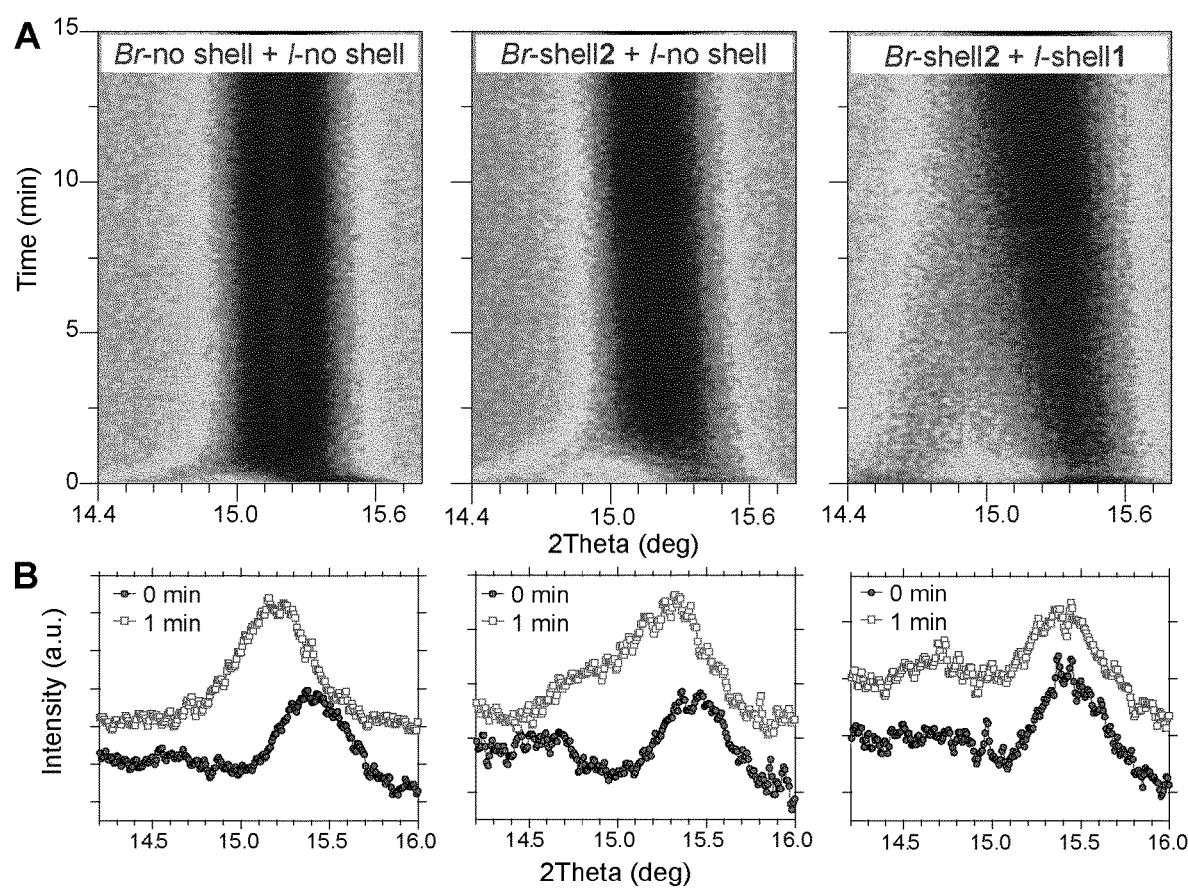
FIG. 18 shows A) Representative 2D maps from the in-situ XRD experiments illustrating the changes observed in the selected 2Theta range during the reaction from $CsPbBr_3$@$AlO_x$ to $CsPb(Br_{0.5}I_{0.5})_3$ with increasing $AlO_x$ shell thickness, specifically: Br-no shell/(left), Br-shell2/Br-no shell (centre), and $CsPbBr_3$@$AlO_x$ shell2/$CsPbI_3$@$AlO_x$ shell1 (right); B) Snapshots at time=0 min and time=1 min from the maps in A).

A representative data set of the temporal evolution of the XRD patterns during the reaction from $CsPbBr_3@AlO_x$ NCs to $CsPb(Br_{0.5}I_{0.5})_3$ NCs with various $AlO_x$ shell thicknesses is shown in FIG. 18A. The maps report the time evolution of the two reagents in a selected region of the XRD spectrum between 14.5 and 15.7 degrees which allows one to monitor the (211) diffraction peak from [$CsPbBr_3@AlO_x$ NCs+ $CsPbI_3@AlO_x$ NCs] at time 0 to the final $CsPb(Br_{0.5}I_{0.5})_3$ composition. For clarity, the corresponding XRD patterns acquired at time 0 and 1 min for these three mixtures are shown in FIG. 18B. It is immediately evident that the thicker the $AlO_x$ shell, the slower the anion exchange reaction, because no change in the XRD pattern is observed after 1 minute for the thicker shell.

Figure 19:
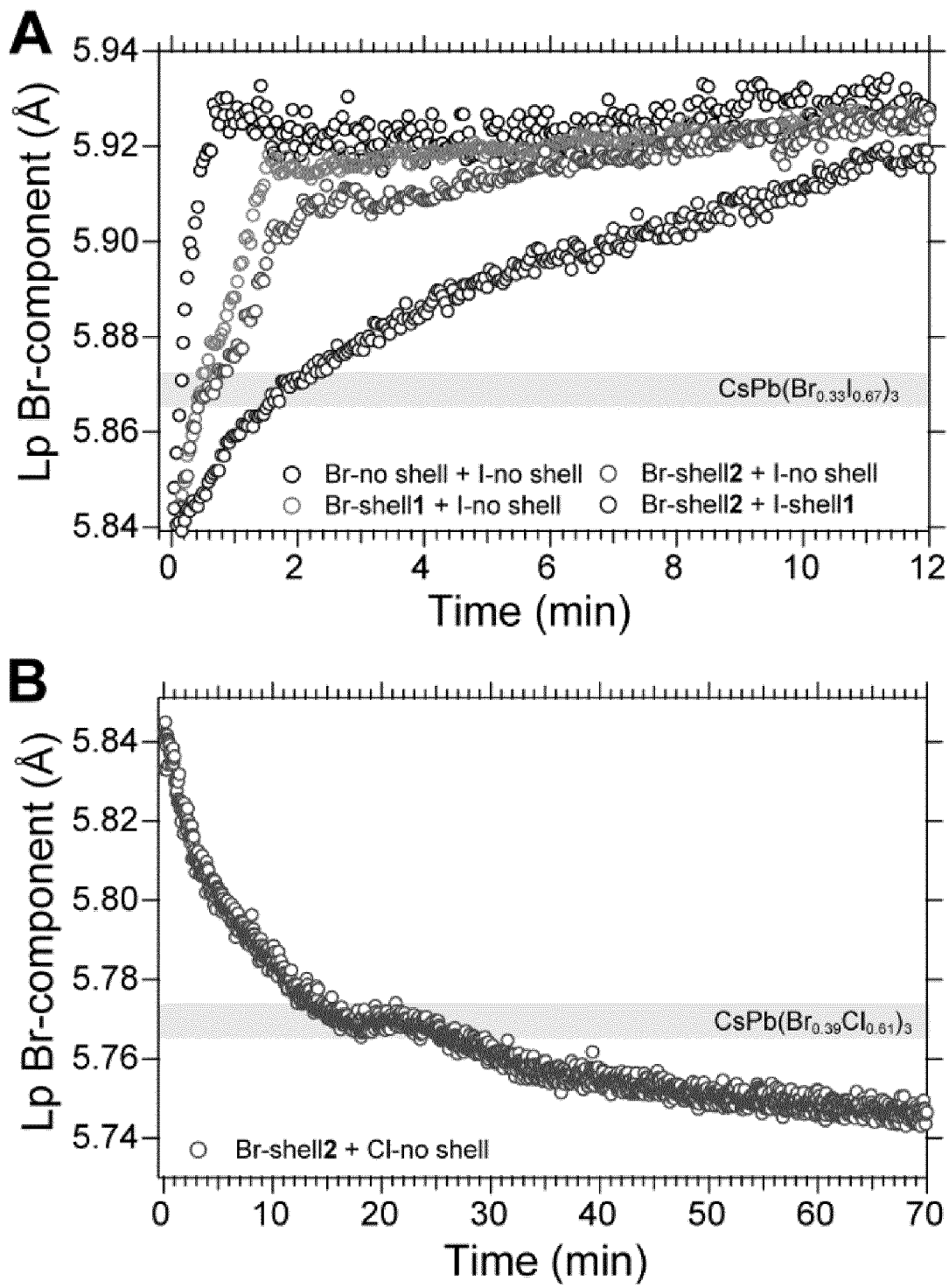
FIG. 19 shows A) Time evolution of the lattice parameters for the $CsPbBr_3$ NCs (Lp Br-component) with increasing shell thickness when reacting with $CsPbI_3$ NCs, specifically: Br-no shell/I-no shell (black), Br-shell1/I-no shell (green), Br-shell2/I-no shell (red), and Br-shell2/I-shell1 (blue); B) Time-dependent change of the Lp for the Br-shell2 in presence of uncoated $CsPbCl_3$ NCs.
Figure 20:
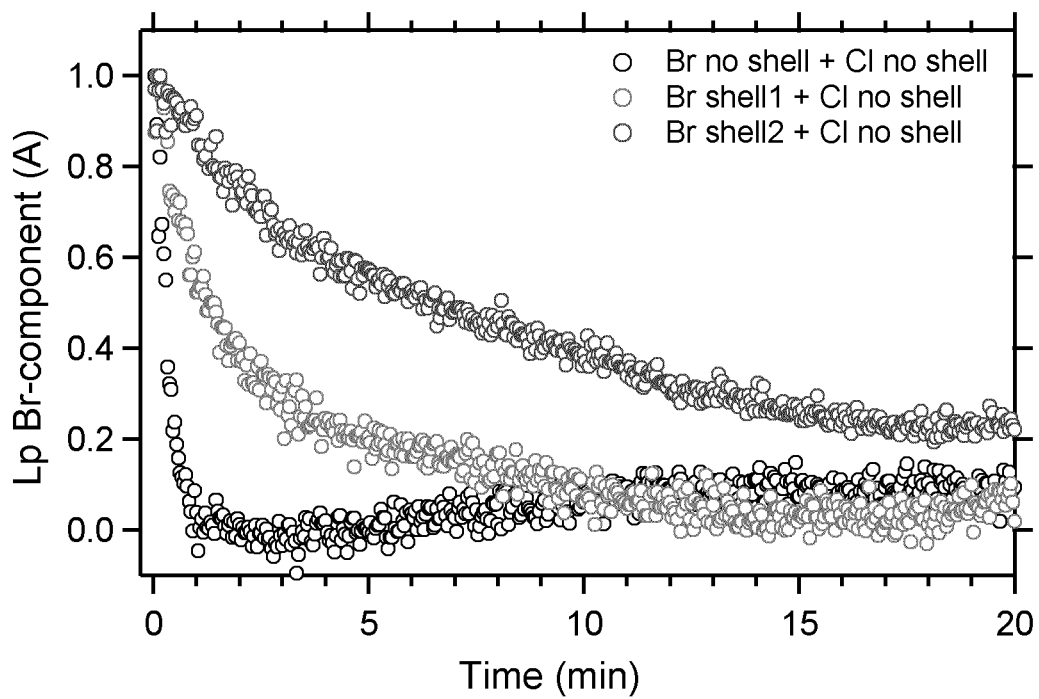
FIG. 20 shows time evolution of the normalized lattice parameters (Lp) for the $CsPbBr_3$ component with increasing shell thickness in presence of $CsPbCl_3$ NCs, specifically: $CsPbBr_3$/$CsPbCl_3$ no shell (black), $CsPbBr_3$ shell1/$CsPbCl_3$ no shell (green) and $CsPbBr_3$ shell2/$CsPbCl_3$ no shell (red). The Lp normalization was performed by fixing the Lp minimum at zero and the Lp maximum at 1 for all set of data.
Figure 21:
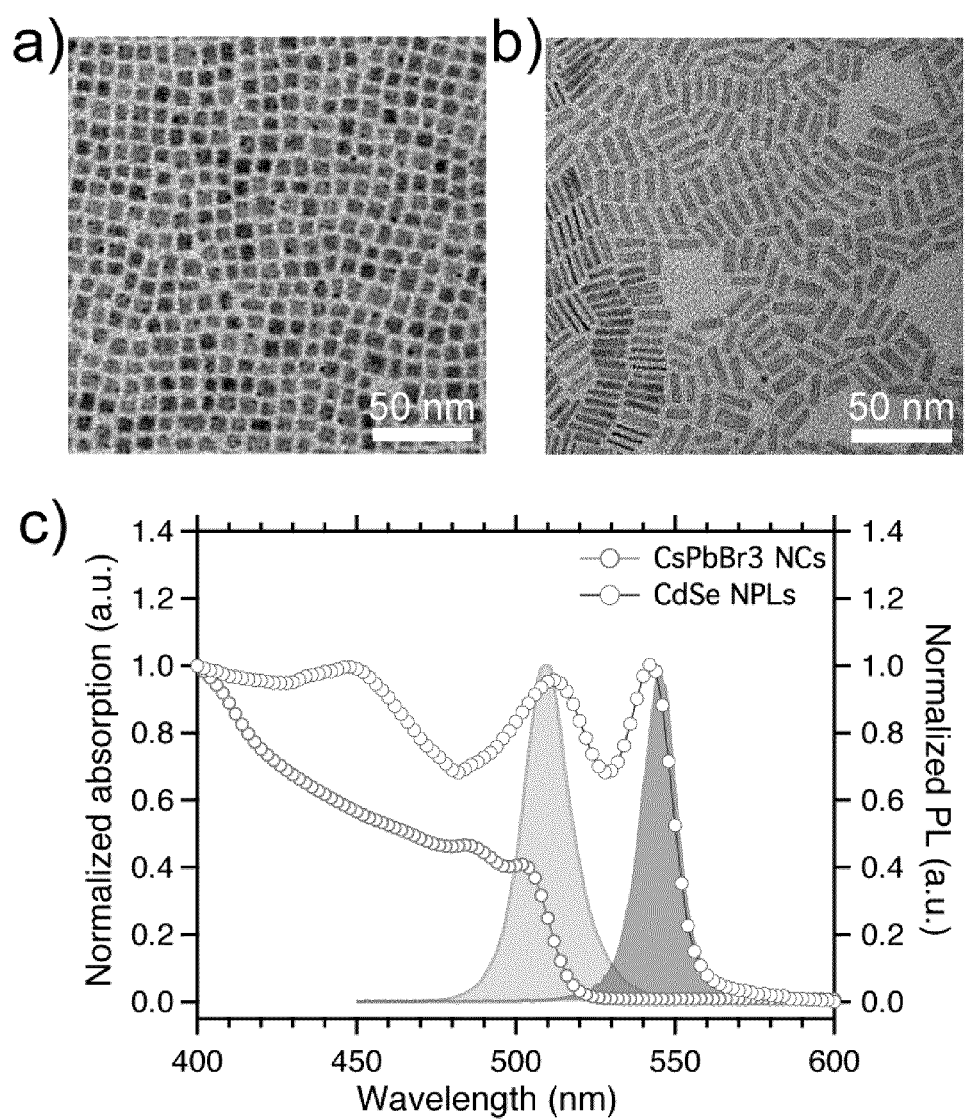
FIG. 21 shows in a,b) the TEM images of the as-synthesized $CsPbBr_3$ NCs and CdSe NPLs used for the semiconductor-semiconductor distance-dependence study and (c) corresponding normalized UV-Vis absorption (scatter line) and photoluminescence (continuous line) spectra acquired in solution.
Figure 22:
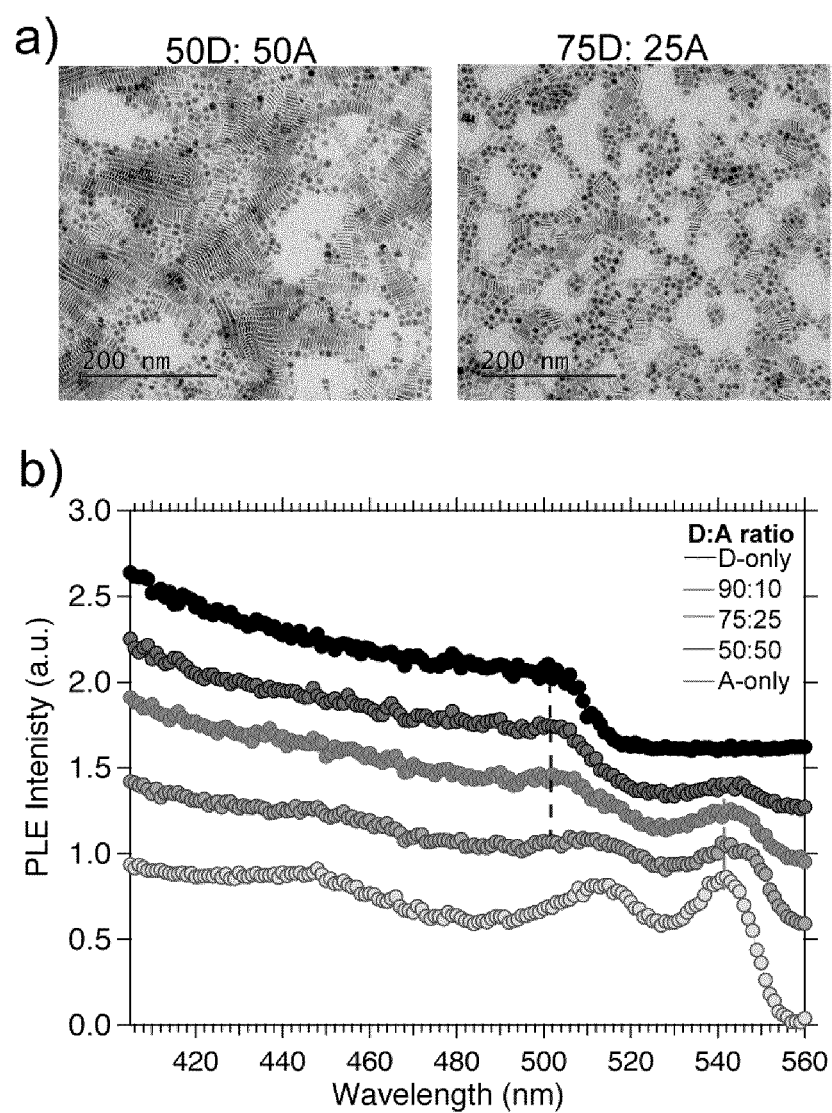
FIG. 22 shows a) the TEM images of $CsPbBr_3$@AlOx NC donor (D) mixed with CdSe NPLs acceptor (A) at 50D:50A (left) and 75D:25A (right) ratios; b) PLE spectra (vertically offset for clarity) collected at 570 nm for films at various D:A for an AlOx shell of 3.6 nm thick. The gray and purple curves are the PLE spectra for the A-only and D-only films. The dashed lines indicate the position of the maximum for the donor (black dashed line) and acceptor (gray dashed lines).
Figure 23:
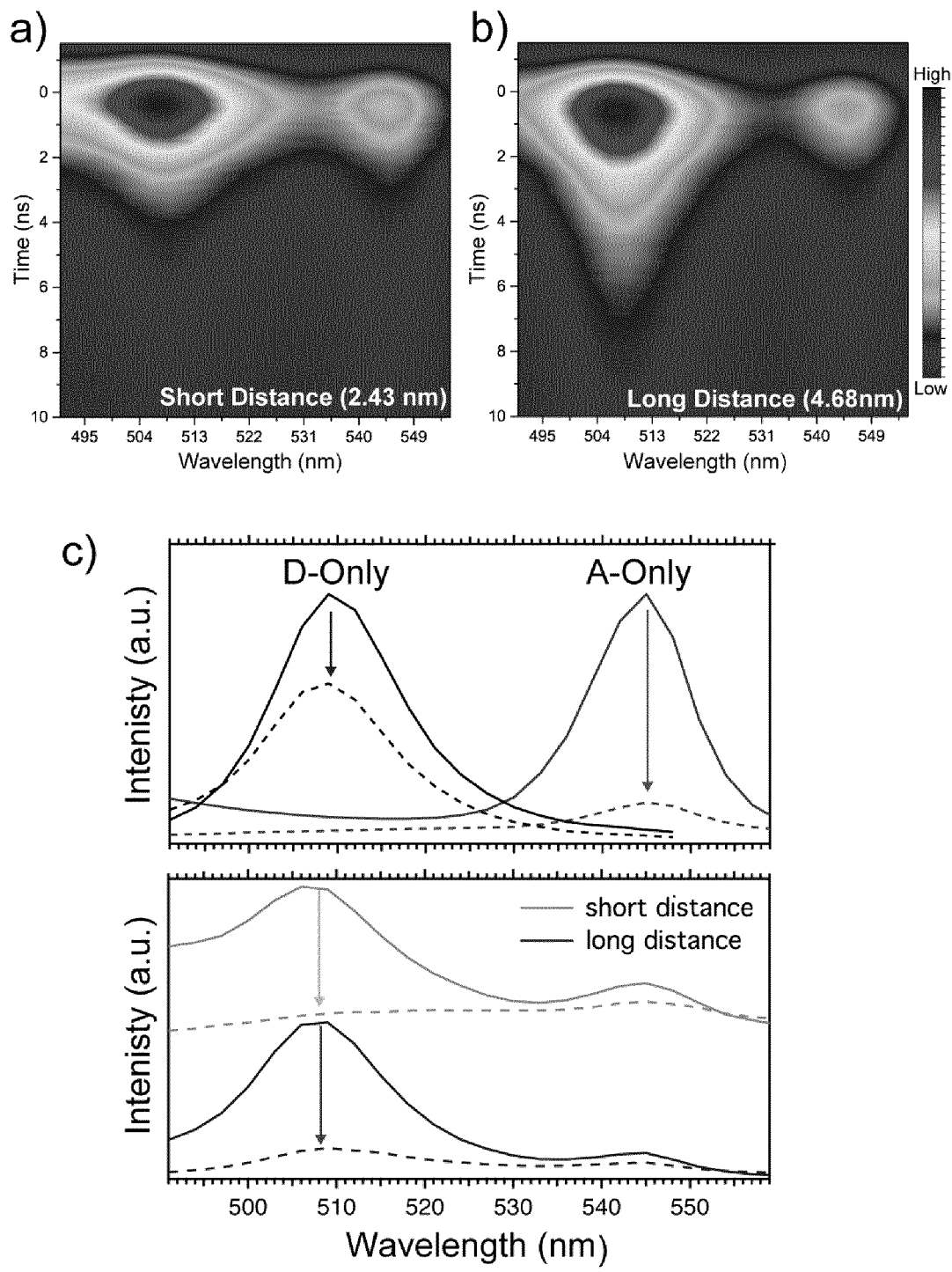
FIG. 23 shows a-b) time- and energy-resolved PL intensity maps for short distance (2.4 nm) and long distance (4.7 nm) in equimolar binary mixtures containing both spectral information and decay dynamics. c) Spectra from early and late time windows 0-10 ns (solid line) and 80-95 ns (dashed line) for the neat donor and acceptor (top) and for the 50% binary mixture at long and short distances.
Figure 24:
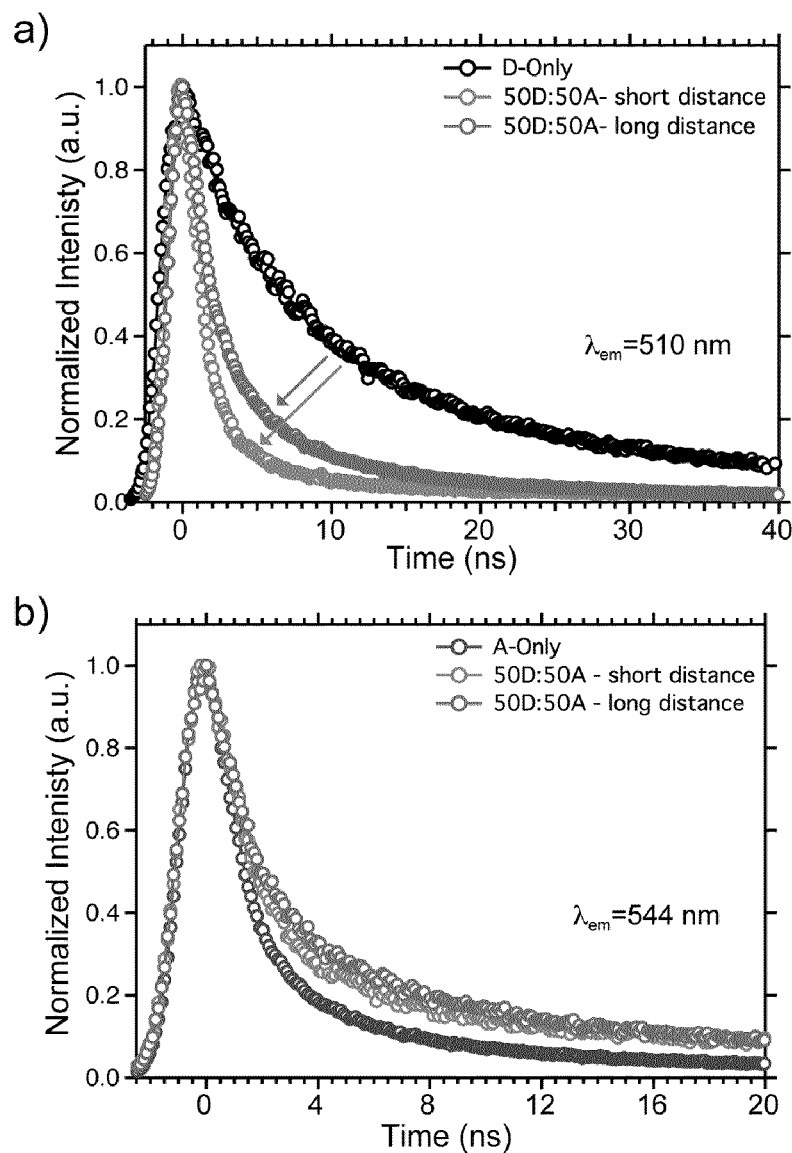
FIG. 24 shows a-b) the decay dynamics of the features centred at 510 nm and 544 nm respectively, comparing the decay dynamics of the neat donor and acceptor with the one in the binary mixture at short and long distances.
Figure 25:
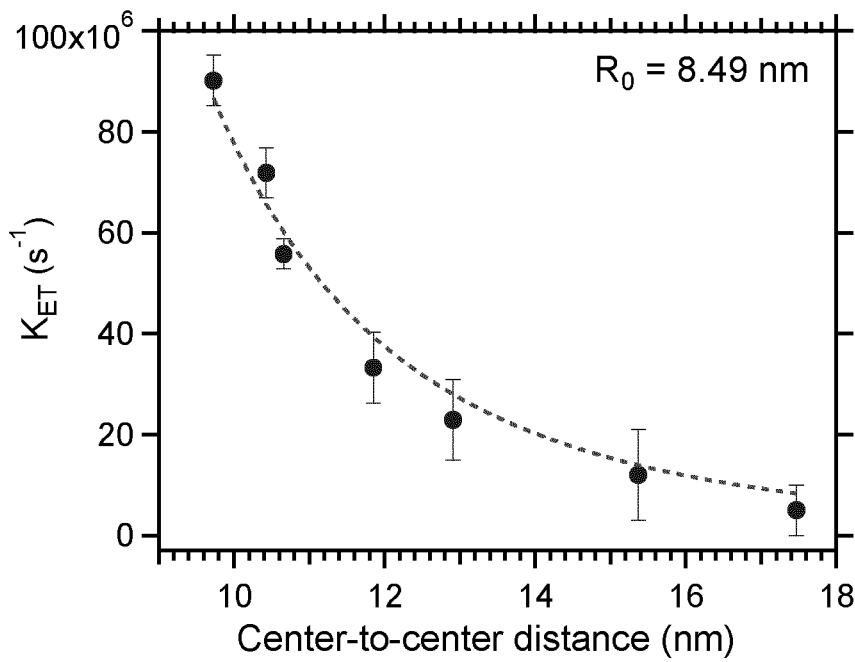
FIG. 25 shows the energy transfer rates ($k_{ET}$) vs. the center-to-center distance calculated for the different AlO$_x$ shell thicknesses. The red dotted line is the fit of the data for $d^{-4}$ giving $R_0$=8.5 nm.

The good separation between the XRD peaks allows for Le Bail refinement. The temporal evolution of the lattice parameters (Lp) obtained from the refinement for all the different mixtures are reported in FIGS. 6A,B and 20. In particular, for the mixture Br/shell2 and I/shell1 the final product composition is obtained after more than 12 min compared to only 1 min in the case of uncoated $CsPbBr_3$ and $CsPbI_3$ NC mixtures (FIG. 19A). Similar experiments were conducted for the mixture with $CsPbCl_3$ NCs (FIG. 19B, 20). In the latter case, the anion exchange reaction between $Cl^-$ and $I^-$ is much slower in agreement with the data obtained by optical probing. In particular, for the mixture Br/shell2 and Cl/no shell in FIG. 19B, the reaction reaches completion after 70 min.

Focusing on the change of Lp over time for the two cases of Br to BrI and of Br to BrCl, some key information were extracted. First of all, the experiments conducted on the uncoated $CsPbX_3$ NC mixtures evidence a very fast structural evolution resulting in an exponential increase of the Lp with time for Br to BrI and in an exponential decrease of the Lp for Br to BrCl (black curves in FIG. 19A and FIG. 20). Second, the temporal evolution of the Lp in the mixture containing $CsPbX_3@AlO_x$ NCs reveal a more complex behaviour for both iodine and chlorine exchange (FIG. 19A,B). In particular, after an initial steady change of the Lp, a deviation from the exponential trend is noticed and a bump, corresponding to the Lp remaining constant for a certain time, is observed. For the iodine exchange, the Lp stays constant at a value of 5.867 Å for a short time (around 10 seconds), to then start to change again with a slower rate of exchange (FIG. 19A). While the $AlO_x$ shell thickness determines the time at which the deviation from the exponential trend occurs (i.e. thicker shell, longer time), the bump is observed always at the same Lp value (highlighted as a grey area in FIG. 19A). A similar behaviour is observed also for the chlorine exchange wherein after around 20 minutes the lattice parameter stabilizes at a value of 5.768 Å and then starts to change with a slower rate of exchange (FIG. 19B). Noteworthy, the change in the rate of exchange occurs in both cases at a specific $CsPb(Br_yI_{1-y})_3$ and $CsPb(Br_yCl_{1-y})_3$ composition, where y=0.33 and 0.39 for iodine and chlorine exchange respectively. These results suggest that the two systems undergo a similar anion exchange mechanism, where at a certain mixed halide ratio a more stable structure is formed and this structure is kept until new ions are incorporated into the structure, and the Lp starts to change with a slower rate until the final composition is obtained. These results can be explained by referring to a recent theoretical study by W.-J. Yin et al., wherein first-principle calculations together with cluster-expansion methods were used to study the structural properties of mixed halide perovskites. It was found that halide perovskites exhibit anomalous alloy properties compared to conventional semiconductors; specifically, they find that a particular stable alloy structure exist for specific composition with formation energies lower than other structures. It was calculated a minimum of formation energy for y=⅓ that is very close to the composition (y=0.33 and 0.39 for iodine and chlorine exchange) where according to the present disclosure it is observed that the lattice parameters have the anomalous change in the rate of ion exchange. The reason for this is that halide perovskite have a strong ionic characters, so Coulomb interactions plays a major role in this case, which lowers the formation energy and favours certain structures. It is interesting to compare the results of the present disclosure from the in-situ structural analysis with those obtained from the in-situ optical monitoring of the anion exchange reaction reported by Kosher et al., wherein the exchange kinetics for uncoated $CsPbBr_3$ NCs mixed with I-oleate and Cl-oleate solutions was studied by following the band gap change. It was observed a very similar trend for the Br-to-Cl transformation, with distinct intervals of constant bandgap which closely resembles structural data of the present disclosure and which are attributed to a transient structure. Instead, for the Br-to-I exchange, the faster exchange kinetics prevents to catch this intermediate transformation and it was concluded that two different exchange mechanisms are taking place in the two systems. These contrasting results compared to data of the present disclosure reinforce the need to slow down the reaction in order to correctly interpret the behaviour of the perovskite and to elucidate the anion exchange mechanisms.

The anion exchange study performed in this work exemplifies the new opportunities offered by nm-thick metal oxide shell around active NC cores. The proposed systems could also act as materials platform to study solid-state ion diffusion across metal oxides, which is extremely interesting for perovskites solar cell, wherein an oxide layer acts both as electron or hole transporting layer to improve the charge transport and to reduce the instability issue due to diffusion of metal contact into the active perovskite layer. In a more general prospective, the oxide shell could enable distance-dependent energy transfer studies between various donor and acceptor NCs (e.g. metal/semiconductor, semiconductor/semiconductor see FIGS. 21-25) as an alternative to using ligands of different lengths.

Figure 26:
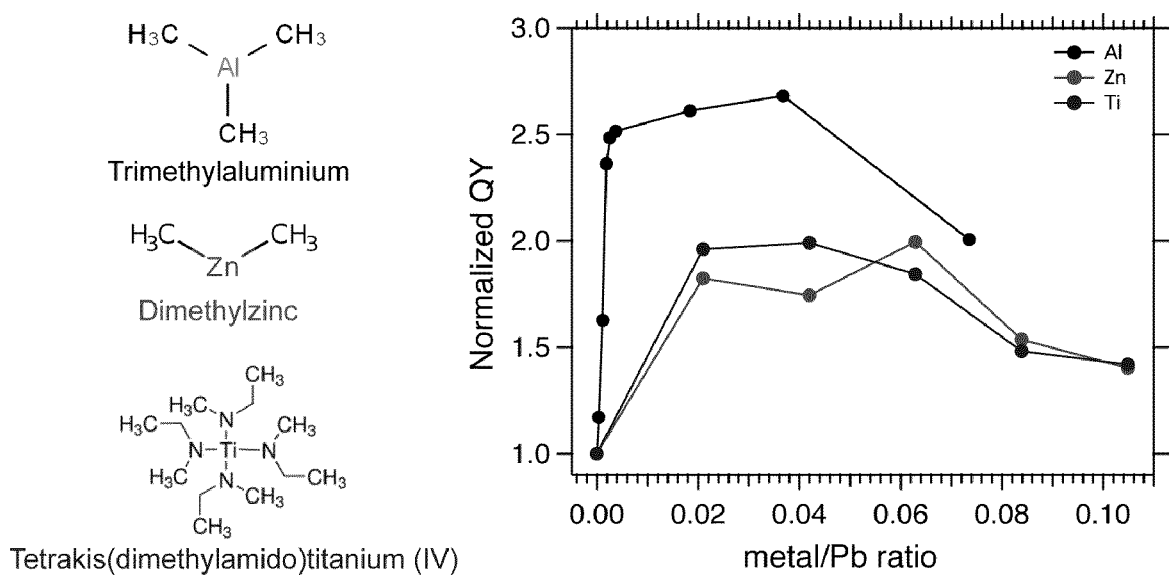
FIG. 26 shows normalized QY for the CsPbBr$_3$ NCs obtained by adding increasing amount of trimethylaluminium (TMA), dymethylzinc and tetrakis(dimethylamido) titanium (IV).
Figure 27:
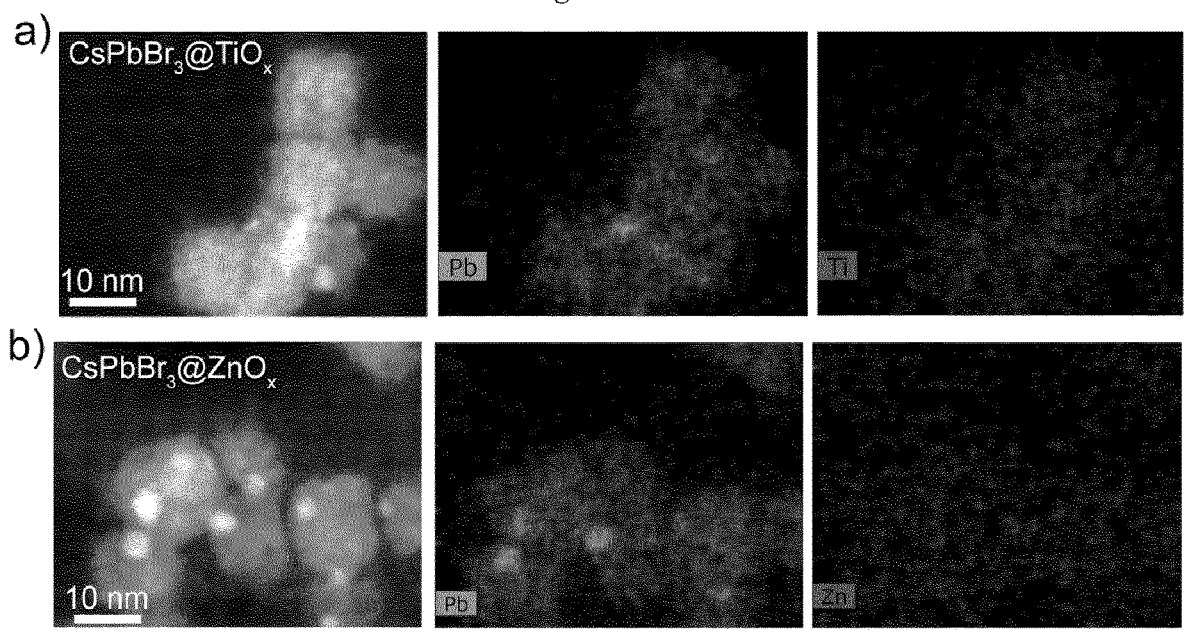
FIG. 27 shows TEM images and corresponding EDX maps of the a) CsPbBr$_3$@TiO$_x$ and b) CsPbBr$_3$@ZnO$_x$ NCs with a TiOx and ZnOx shells grown by using the c-ALD.
Figure 28:
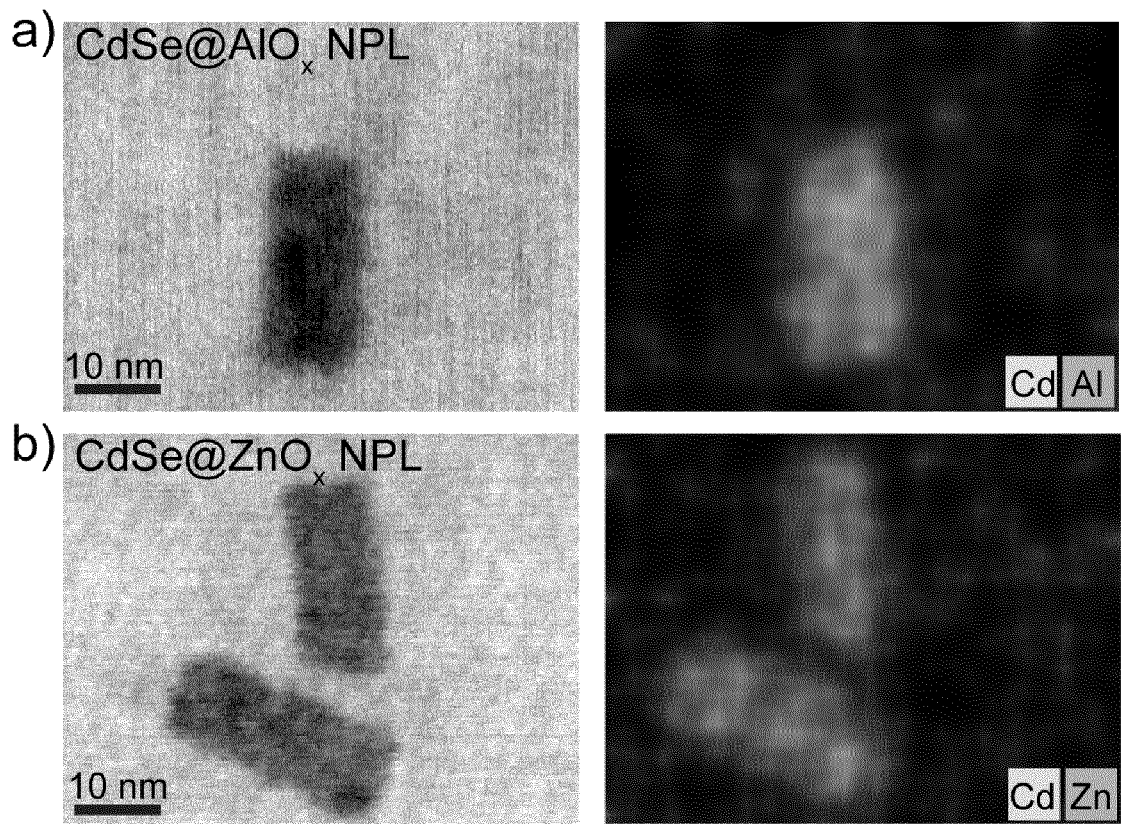
FIG. 28 shows the TEM images and corresponding EDX map of the a) CdSe@AlO$_x$ and b) CdSe@ZnO$_x$ NCs with a AlOx and ZnOx shells grown by using the c-ALD.
Figure 29:
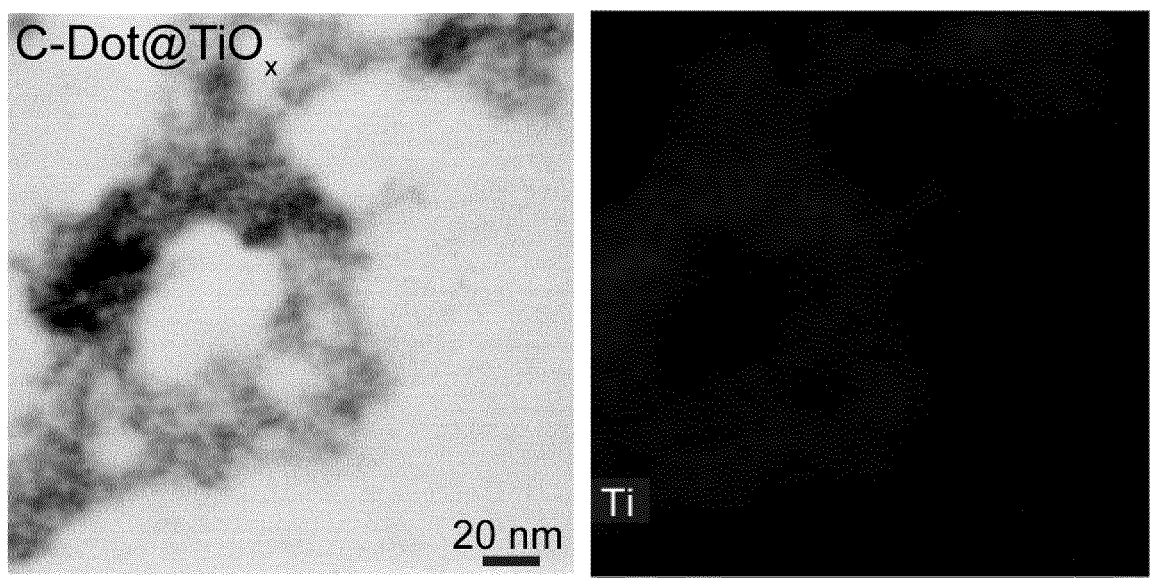
FIG. 29 shows TEM image and corresponding EDX map of the C-Dot@TiO$_x$ with an AlOx and ZnOx shells grown by using the c-ALD.

The generality of the developed c-ALD method is further demonstrated by applying it to different cores and different metal oxide shells. In particular $CsPbBr_3$ NCs with a shell of titanium oxide and zinc oxide are shown in FIGS. 26-27; CdSe nanoplates (NPLs) with a shell of zinc oxide and titanium oxide are shown in FIG. 28; carbon dots (C-Dots) with a shell of titanium oxide is shown in FIG. 29.

Another aspect of the present invention provides a use of the core-shell nanocrystals of the invention as quantum dots or semiconductor nanocrystals.

Another aspect of the present invention provides a quantum dot light emitting diode (QD-LED) comprising at least one core-shell nanocrystal of the invention.

Quantum dot light emitting diodes (QD-LEDs) are used for example for display and lighting sources. Inorganic quantum dot light emitters have a few advantages over OLEDs and other light-emitting diodes, which include stability, solution processability and excellent colour purity. Quantum dots (QDs) are semiconductor nanocrystallites whose radii are smaller than the bulk exciton Bohr radius. Quantum confinement of electrons and holes in all three dimensions leads to an increase in the effective band gap of the QDs with decreasing crystallite size, where the optical absorption and emission of quantum dots shift to higher energies (blue shift) as the size of the dots decreases. For example, a CdSe QD can emit light in any monochromatic visible color depending only on the size of the QD and can be used to form QD-LEDs arrays that emit white light.

Embodiments of the invention are directed to quantum dot light emitting diode (QD-LED) that include a light emitting layer having a plurality of quantum dots and an electron injection and transport layer having a plurality of inorganic nanoparticles, wherein the quantum dots are the core-shell nanocrystals of the invention, wherein preferably the core-shell nanocrystals of the invention are perovskite@AlOx.

Metal oxide core-shell nanocrystals can be used and implemented in many areas of science, including biology, health care and catalysis. For example, the core-shell nanocrystals of the invention can be used as electro-catalyst for example for $CO_2$ reduction, oxygen and hydrogen evolution reactions. Other catalytic applications are in thermal catalysis for various conversion reactions. It has been demonstrated that the presence of a metal oxide shell around a metal-containing nanocrystal core improves the stability and might improve also activity and selectivity. In the same way, the core-shell nanocrystals of the invention have been used in bio-applications such as controlled and targeted drug delivery, cell labelling and tissue engineering applications. For catalytic applications and bio-applications, the core-shell nanocrystals of the invention are preferably metal@AlOx.

Embodiments of the inventions are directed to catalytic and bio-devices that include at least one core-shell nanocrystals of the invention.

In accordance with a still further aspect of the present invention, there is provided a catalytic material comprising at least one core-shell nanocrystals of the invention. In preferred embodiments, the catalytic material is selected from the group comprising electro-catalyst, photo-catalyst, thermal-catalyst.

In accordance with a still further aspect of the present invention, there is provided a bio-material comprising at least one core-shell nanocrystals of the invention. In preferred embodiments, the bio-material is selected from the group comprising controlled and/or targeted drug delivery materials, cell labelling materials.

In accordance with a still further aspect of the present invention, there is provided a photovoltaic device comprising at least one core-shell nanocrystals of the invention.

In accordance with a still further aspect of the present invention, there is provided a light emitting material or device comprising at least one core-shell nanocrystals of the invention.

In accordance with a still further aspect of the present invention, there is provided an ink or paint comprising at least one core-shell nanocrystals of the invention.

In accordance with a still further aspect of the present invention, there is provided a display including at least one core-shell nanocrystals of the invention.

In accordance with a still further aspect of the present invention, there is provided an electronic device including at least one core-shell nanocrystals of the invention.

Those skilled in the art will appreciate that the invention described herein is susceptible to variations and modifications other than those specifically described. It is to be understood that the invention includes all such variations and modifications without departing from the spirit or essential characteristics thereof. The invention also includes all of the steps, features, compositions and compounds referred to or indicated in this specification, individually or collectively, and any and all combinations or any two or more of said steps or features. The present disclosure is therefore to be considered as in all aspects illustrated and not restrictive, the scope of the invention being indicated by the appended claims, and all changes which come within the meaning and range of equivalency are intended to be embraced therein.

The foregoing description will be more fully understood with reference to the following Examples. Such Examples, are, however, exemplary of methods of practising the present invention and are not intended to limit the application and the scope of the invention.

EXAMPLES

Chemicals. All chemicals were purchased from Sigma Aldrich and used without purification, unless specified. Cesium carbonate ($Cs_2CO_3$, 99.9%), lead (II) bromide ($PbBr_2$, 99.99%, Alfa Aesar), lead (II) iodide ($PbI_2$ 99.9985%, Alfa Aesar), lead (II) chloride ($PbCl_2$, 99.99%), oleic acid (OLAC, technical grade 90%), oleylamine (OLAM, technical grade 70%), 1-octadecene (ODE, technical grade 90%), octane (anhydrous, ≥99%), toluene (anhydrous, ≥99%), N,N-dimethylformamide, (DMF, anhydrous, ≥99%), methyl acetate (MeOAc, anhydrous 99.5%), Cerium (III) nitrate hexahydrate ($Ce(NO_3)_3·6H_2O$ (99%)), Silver nitrate ($AgNO_3$), trimethyloxoniumtetrafluoroborate ($Me_3OBF_4$) and Trimethylaluminium (98%, Strem).

Material Synthesis.

Synthesis of Cs-oleate (Cs-OLA) precursor: 0.8 g of $Cs_2CO_3$, 2.5 mL OLAC and 80 mL ODE were added to a 100 mL 3-necked round bottom flask and stirred under vacuum for 1 h at 120° C. The flask was purged with $N_2$ for 10 min and then placed back under vacuum. This process of alternately applying vacuum and $N_2$ was repeated for a total of 3 times to remove moisture and $O_2$. The reaction temperature was increased to 150° C. and kept at this temperature until the solution was clear, indicating that the $Cs_2CO_3$ has completely reacted with the OLAC. The Cs-OLA solution in ODE was stored in $N_2$ until needed for the NC synthesis. This Cs-OLA was used for the synthesis of $CsPbBr_3$ and $CsPbCl_3$ NCs. Instead for the synthesis of $CsPbI_3$ NCs the amount of reagents was slightly different: 0.25 g of $Cs_2CO_3$, 1 mL OLAC and 25 mL ODE, while the procedure was kept the same.

$CsPbX_3$ NCs synthesis. $CsPbX_3$ NCs were synthesized by following procedure. For the synthesis of $CsPbBr_3$ and $CsPbCl_3$ NCs: $PbBr_2$ (0.21 g) or $PbCl_2$ (0.26 g) and ODE (15 mL) were stirred in a 50 mL round bottom flask and degassed under vacuum at 120° C. for 1 h. The flask was then filled with $N_2$ and kept under constant $N_2$ flow. OLAC and OLAM (1.5 mL each) were injected and the mixture was kept at this temperature until all the $PbBr_2$ was dissolved. The temperature was then increased to 165° C. The Cs-OLA (1.2 mL) precursor, pre-heated to 100° C. under $N_2$ atmosphere, was swiftly injected into the reaction mixture. The reaction mixture turned yellow or white and the reaction was quenched by immediate immersion of the flask into an ice bath (~5 s after injection). The synthesized NCs were precipitated by centrifugation at 6000 rpm for 30 min, the supernatant was removed and the NCs were re-dissolved in 1.5 ml of hexane. A second wash was carried out by adding ethyl acetate in a ratio 1:1 with hexane, the mixture was centrifuged and the precipitate was dissolved in octane obtaining a final concentration of ~10 mg/ml. The synthesis of $CsPbI_3$ NCs was carried in the same way with some modification in the amount of reagent used: $PbI_2$ (0.70 g), 35 ml ODE, OLAC and OLAM 3.5 each and 5.6 ml of Cs-OLA prepared as described previously was injected. Methyl acetate was used for the second washing.

$CeO_2$ NCs synthesis. $CeO_2$ NCs were synthesized by following procedure. 1 mmol of $Ce(NO_3)_3·6H_2O$ was mixed with 1 mL of OLAM in 6.3 mL of ODE at room temperature and dissolved at 80° C. for 30 min. $CeO_2$ NCs were grown by heating the mixture at 260° C. for 2 h. The as-prepared NCs were purified by washing, precipitation and centrifugation cycles, using ethanol, acetone and hexane at least 4 cycles to remove any unreacted cerium precursor, surfactants, and excess ODE. The resultant dark brown precipitate was re-dispersed in octane in a concentration of around 10 mg/ml.

Ag NCs synthesis. Ag NCs were synthesized by following procedure. 1 mmol $AgNO_3$ was mixed with 20 ml OLAM at room temperature followed by heating up to 60° C., which was maintained until the granular $AgNO_3$ crystals were completely dissolved. The solution was then quickly heated up (≥10° C./min) to 180° C. and the temperature was maintained for 1 hr before the reaction system was cooled down to room temperature. The resulting dark-brown solution was washed with acetone and re-dispersed in octane. Size-selective precipitation was used to narrow their size distribution.

Figure 9:
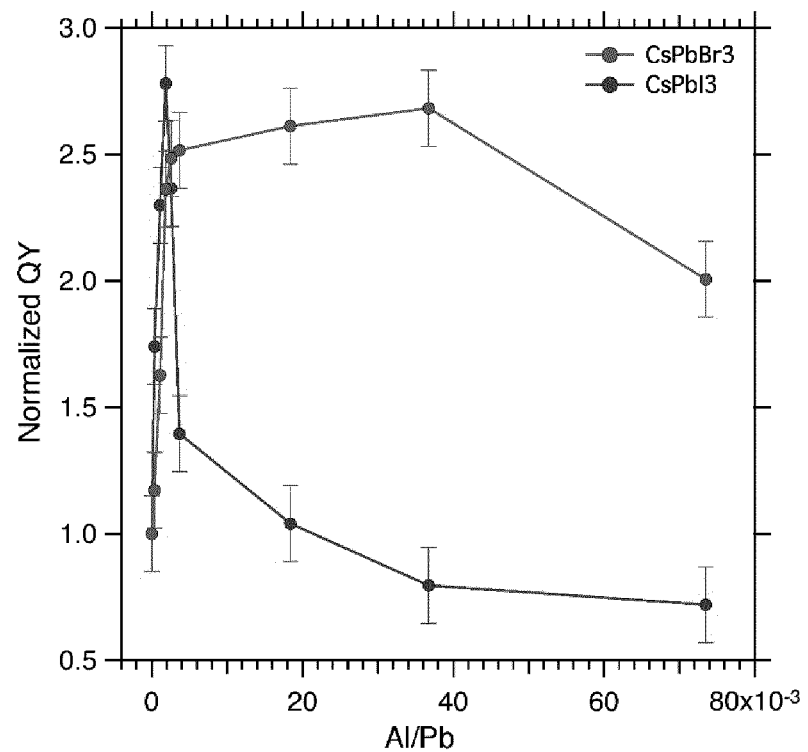
FIG. 9 shows normalized Quantum Yield (QY) for the $CsPbBr_3$ and $CsPbI_3$ NCs obtained by adding increasing amount of trimethylaluminium (TMA).

Ligand Exchange on Ag NCs. Ag NCs with OLAC as ligand were obtained by using ligand-stripping procedure. 1 ml of acetonitrile containing $MeO_3BF_4$ was added to 1 ml of Ag NCs with native OLAM ligands (Ag—OLAM NCs) dispersed in hexane (with a concentration of 10 mg/ml by ICP-OES); after 1 min stirring, 1 ml of toluene was added and the mixture was centrifuged to allow NCs precipitation. The obtained NCs were dispersed in 1 ml DMF. Successively 1 ml of hexane containing OLAC was added to the NCs dispersed in DMF and after 1 min stirring, the NCs were precipitated and re-dispersed in octane. Ag NCs with oxidized surface (Ag—$AgO_x$ NCs) were obtained by flowing for 1 hr pure $O_2$ gas into the Ag—OLAM NC solution.

c-ALD synthesis. In a 3-necked flask a solution of NCs (typically 150 µl of NCs solution with a concentration of 5 mM) dispersed (dissolved) in octane as the solvent was gently stirred under $N_2$ flow. An extra amount of octane (typically 2 ml) was added so to ensure good NCs separation and to guarantee an homogeneous shell growth. FIG. 2 sketches the synthesis set-up. One c-ALD cycle consists of: 1) drop-wise addition of TMA diluted in octane to the NC solution (the optimized rate of the syringe pump was fixed at 1 ml/h); 2) 5 min waiting time so to ensure that the reaction in step 1) was completed; 3) addition of $O_2$ gas by mean of a mass flow controller; 4) 5 min waiting time. This cycle is repeated n-times to reach the desired thickness. The optimal amount of TMA (80 µl from a diluted TMA solution in octane with a concentration of $0.4*10^{-3}$ µM) to add each cycle was obtained by monitoring the change of the $CsPbX_3$ NCs' optical properties upon addition of increasing amount of TMA (FIG. 9). The optimal amount could slightly change from batch to batch. The full process was automated by a home-made Lab-View software where precursor amount, injection speed, and waiting time are independently defined. Different c-ALD conditions were tested to optimize the process (FIG. 10). In order to retain the colloidal stability in the organic solvent of the as-synthesized core-shell NCs, OLAC was introduced in place of TMA after 8-10 cycles. This step functionalizes the surface of the shell which can continue to grow without any precipitation of the NCs. A gas tight syringe was used for the TMA injection to ensure that the TMA concentration stayed unchanged during the full process. The TMA is used in very diluted amount to avoid any safety issue.

CsPbBr$_3$ NCs synthesis. PbBr$_2$ (0.21 g) and ODE (15 mL) were stirred in a 50 mL round-bottom flask and degassed under vacuum at 120° C. for 1 h. The flask was then filled with N$_2$ and kept under constant N$_2$ flow. OLAC and OLAM (1.5 mL each) were injected, and the mixture was kept at this temperature until all the PbBr$_2$ was dissolved. The temperature was then increased to 165° C. The Cs-OLA (1.2 mL) precursor, preheated to 100° C. under N$_2$ atmosphere, was swiftly injected into the reaction mixture. The reaction mixture turned yellow, and the reaction was quenched by immediate immersion of the flask into an ice bath (~5 s after injection). The synthesized NCs were precipitated by centrifugation at 6000 rpm for 30 min, the supernatant was removed, and the NCs were re-dissolved in 1.5 mL of hexane. A second wash was carried out by adding ethyl acetate in a 1:1 ratio with hexane, the mixture was centrifuged, and the precipitate was dissolved in octane, giving a final concentration of ~10 mg/mL.

CdSe NPLs synthesis. Cd(myristate)$_2$ was synthesized according to reported procedure.[22] 170 mg of Cd(myristate)$_2$ and 14 ml of ODE were degassed for 30 min at room temperature in a three neck-flask. Then under N$_2$ the flask was heated to 240° C. Meanwhile, 12 mg of Se powder was sonicated in 1 ml ODE for 5 min. At 240° C. the Se solution was quickly injected in the reaction mixture and after 20 seconds (the solution became dark orange), 60 mg of Cd(Ac)$_2$ was introduced. The reaction mixture was kept at 240° C. for 10 min and then was cooled down with to 150° C. with air-flow, and allowed to slowly cool down further. At 70° C., 2 ml of OLAC in 10 ml of hexane were added to the reaction flask. The mixture was taken to the glove box to carry out the washing procedure, which consist in centrifugation and redeseprsion in hexane. Please note that a little percentage of spherical CdSe NCs may be present together with the CdSe NPLs that were removed through size selective precipitation.

Preparation of CsPbBr$_3$@AlOx with different AlOx thickness. In a three-necked flask, a solution of CsPbBr$_3$ NCs in octane (typically 150 µL of a 5 mM solution in octane) was gently stirred under N$_2$ flow. An additional amount of octane (typically 2 mL) was added to ensure a good dispersion so to guarantee a homogeneous growth of the shell. One c-ALD cycle consists of (1) dropwise addition (1 mL/h) of trimethyl aluminium (TMA) diluted in octane to the NC solution; (2) 5 min waiting time to ensure that the reaction in step 1 was completed; (3) addition of O$_2$ gas by mean of a mass flow controller; and (4) 5 min waiting time. This cycle is repeated n times to reach the desired thickness. 80 µL from a diluted TMA solution in octane with a concentration of 0.4×10$^{-3}$ µM were added each cycle. Some minimal adjustment might be needed from batch to batch. The full process was automated by using a custom-made Lab-View program where precursor amount, injection speed, and waiting time are independently defined. In order to retain the colloidal stability in the organic solvent of the as-synthesized core@shell NCs, OLAC was introduced in place of TMA after 8-10 cycles. This step functionalizes the surface of the shell, which can continue to grow without any precipitation of the NCs. CsPbBr$_3$@AlO$_x$ NCs with different shell thickness were synthesized ranging from 1.5 to 10 nm thick.

Characterizations. Electron Microscopy. Transmission electron microscopy (TEM) images were acquired on a FEI Tecnai-Spirit at 120 kV. High-angle annular dark-field scanning TEM (HAADF-STEM) images and X-ray energy dispersive (EDX) elemental maps were acquired on a FEI Tecnai-Osiris at 200 kV. This microscope is equipped with a high brightness X-FEG gun, silicon drift Super-X EDX detectors and a Bruker Esprit acquisition software. Samples were prepared by dropping hexane or octane solution containing the nanoparticles on the surface of ultrathin carbon-coated copper grids (Ted Pella, Inc.).

Optical Spectroscopy. All optical measurements including photoluminescence (PL) emission spectra, time-resolved fluorescence lifetimes (TRPL) and quantum yield (QY) measurements were collected on a Horiba Jobin Yvon Fluorolog-3 with a PMT as detector. The crude CsPbX$_3$ NC solutions were diluted in octane to reach an optical density of about 0.1-0.2 at the excitation wavelength. For the TRPL the excitation source is a Horiba nanoLED-370 with an excitation wavelength of 369 nm, a pulse duration of 1.3 ns and a repetition rate of 100 kHz. The absolute QY measurements were performed in the integrating sphere Fluorolog-3 accessory where a quartz cuvette containing the sample was placed. The sample was excited with a monochromated xenon lamp at 470 nm. The emitted light was collected at the exit of the sphere by a PMT detector. For each sample, four measurements were performed: (i) the sample emission ($S_{em}$) that collect the photons emitted by the sample; (ii) the blank emission ($B_{em}$) that collects the emission from the cuvette containing only the solvent; (iii) the sample excitation ($S_{exc}$), that records the photons at the pumping wavelength that are not absorbed by the sample; (iv) the blank excitation ($B_{exc}$), that records the photons at the pumping wavelength through the blank. The QY was then calculated as:

$$QY(\%) = \frac{S_{em} - B_{em}}{B_{exc} - S_{exc}} \times 100$$

Any reabsorption correction factor was neglected in our calculation of QY, since the solutions investigated were diluted to the point that reabsorption of the PL could be neglected. The final reported QY are an average over 3 measurements.

UV-vis absorption measurements were performed in transmission mode using a PerkinElmer Lambda 950 spectrophotometer equipped with a deuterium lamp as a light source for the ultraviolet range and a tungsten halide lamp as a light source for the visible and infrared range, and a PMT with a Peltier-controlled PbS detector.

Dynamic Light Scattering (DLS). DLS measurements were carried out using a Zetasizer Nano ZS (Malvern) instrument. The Nano ZS system is equipped with a 4 mW red laser (633 nm) and a detection angle of 173°. The samples were prepared in a quartz cuvette in octane solvent. For each sample 3 measurements were performed with a fixed run time of 10 s. The Malvern DTS 5.10 software was applied to process and analyze the data.

Attenuated Total Reflectance-Fourier Transform Infrared Spectroscopy (ATR-FTIR). ATR-FTIR was performed using a Perkin Elmer instrument Spectrum 100 by drop-casting 30 µl of the NC solution on the ATR window, and measured with a resolution of 4 cm$^{-1}$.

Inductively Coupled Plasma-Optical Emission Spectrometry (ICP-OES). ICP-OES was performed on Agilent 5100 model to determine the $CsPbX_3$ NCs, $CeO_2$ NCs and Ag NPs concentration. 5 standard solutions of Pb, Ce and Ag were prepared to obtain the calibration curve used to determine the concentrations of the digested nanocrystal solution. The sample solution was prepared by dissolving the nanocrystals in 70% $HNO_3$ followed with the addition of a specific amount of ultrapure water until the solution reaches the 2% acid content needed for the analysis.

Figure 15:
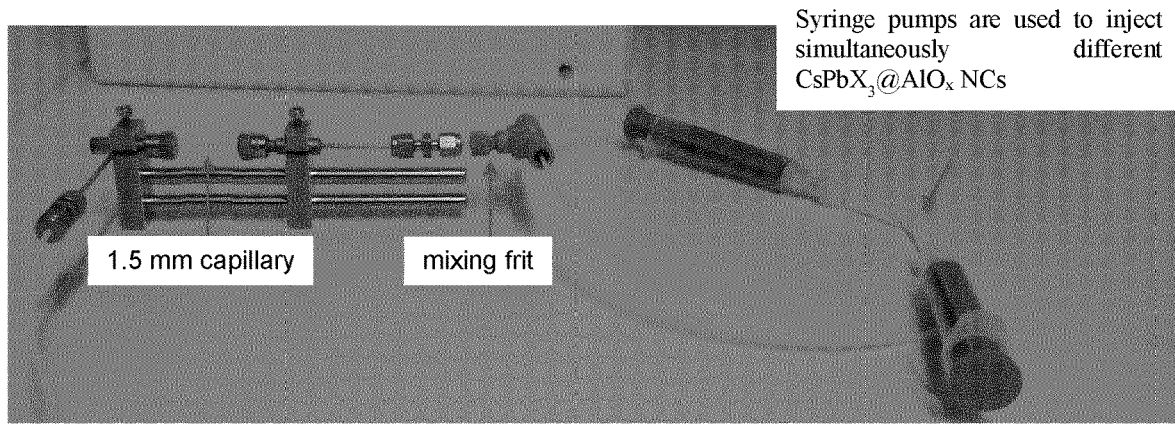
FIG. 15 shows Photo of the set-up used during in-situ XRD anion exchange experiments.

Synchrotron set-up. The series of in-situ XRD experiments were carried out. A custom-made capillary flow cell was used and two syringe pumps to inject the different NCs into the probed volume within a glass capillary (FIG. 15). The XRD patterns were recorded with a PILATUS 2M detector. Acquiring XRD data 10 s started before the injection took place, one pattern each 2.5 seconds. A lambda of 0.64066 Å was used for all the experiments. The spot size was adjusted to the capillary size (1.5 mm external diameter, 0.01 mm wall thickness). The diffraction patterns were analyzed using TOPAS 5. The calibration of diffractometer parameters was done with $LaB_6$ NIST standard and PyFai software. The raw data were processed into powder patterns with Bubble. To monitor the evolution of the lattice parameters, all patterns were fitted using the Le Bail method. The utilized crystallographic data were taken from the ICSD database: $CsPbBr_3$ (Pm-3m, collection code: 97852), $CsPbI_3$ (Pm-3m, collection code: 161481), and $CsPbCl_3$ (Pm-3m, collection code: 29067).

Determination of metal oxide (such as AlOx) shell thickness. The $AlO_x$ shell thickness was determined by grazing incident small angle X-ray scattering (GISAXS) and Dynamic Light Scattering (DLS) measurements.

GISAXS measurements: GISAXS measurements were performed at the ID10-EH1 beamline at the ESRF—European synchrotron in Grenoble. The X-Ray energy was set to 22 KeV (0.56356 Å) and the distance between the sample and the detector was fixed at 4284.5 mm. The beam size was 35 μm tall by 13 μm wide at the sample position. The grazing-incident angle of the X-ray beam was 0.078°. 2D scattering data were collected by using a Maxipix 2×2 (CdTe)—EH2 detector which was calibrated using a Ag-Behenate standard. $CsPbBr_3@AlO_x$ NCs with different shell thickness were deposited on 1×1 $cm^2$ silicon substrates. The inter-particle distance between the NCs was extracted by integrating the 2D maps at azimuthal angle by using Fit2D software.

DLS measurements: were carried out using a Zetasizer Nano ZS (Malvern) instrument. The Nano ZS system is equipped with a 4 mW red laser (633 nm) and a detection angle of 173°. The samples were prepared in a quartz cuvette in octane solvent. For each sample, three measurements were performed with a fixed run time of 10 s. The Malvern DTS 5.10 software was applied to process and analyse the data.

The invention claimed is:

1. A colloidal atomic layer deposition (c-ALD) method for producing core-shell nanocrystals consisting of a metal-containing nanocrystal core and a shell layer comprising at least one metal oxide material, the method comprising:
   a) providing metal-containing nanocrystal cores selected from the group consisting of a semiconductor, a metal, a metal oxide, and a combination thereof,
      wherein the semiconductor is selected from the group consisting of CdSe, ZnSe, InP, $Zn_3P_2$, InSe, $CsPbX_3$ (wherein X is Br, I, or Cl), and a combination thereof,
      wherein the metal is selected from the group consisting of Ag, Au, Pt, Pd, and a combination thereof, and
      wherein the metal oxide is selected from the group consisting of $CeO_2$, ZnO, $TiO_2$, $SiO_2$, and a combination thereof,
   b) dispersing metal-containing nanocrystal cores in an organic solvent under inert gas to provide a reaction mixture and maintaining the reaction mixture under inert gas atmosphere,
   c) introducing one or more highly reactive organometallic compounds to the reaction mixture, wherein the one or more highly reactive organometallic compounds are able to produce volatile secondary products during the reaction and are selected from the group consisting of trimethyl aluminum, dimethylzinc, tetrakis(dimethylamido)titanium(IV), trymethylindium, trymethylgallium, and a combination thereof,
   d) waiting for sufficient time to allow reaction and then deposition of the one or more highly reactive organometallic compounds on the surface of the metal-containing nanocrystal cores,
   e) introducing the pure oxygen to the reaction mixture,
   f) waiting for sufficient time to obtain formation of a metal oxide layer on the surface of the metal-containing nanocrystal cores and thereby growth of a metal oxide shell on the surface of the metal-containing nanocrystal cores,
   g) sequentially repeating steps c) to f) until an optimal thickness of the metal oxide shell is obtained on the surface of the metal-containing nanocrystal cores;
   h) introducing terminating ligands selected from the group consisting of a fatty acid, a C12-C18 long chain amine and a phosphine oxide, and a combination thereof, to the reaction mixture to stop the growth of the metal oxide shell.

2. The method of claim 1, wherein the method is conducted as a one-pot reaction, in which the metal-containing nanocrystal cores, the organic solvent, the inert gas, the highly reactive organometallic compounds, the pure oxygen and the ligand molecule are added to a reactor to form the core-shell nanocrystals.

3. The method of claim 1, wherein the organic solvent is selected from the group consisting of saturated aliphatic hydrocarbons selected from the group consisting of pentane, hexane, heptane, octane, nonane, decane, undecane, and dodecane; saturated alicyclic hydrocarbons selected from the group consisting of cyclohexane and cycloheptane; and aromatic hydrocarbons selected from the group consisting of toluene, xylene, trimethylbenzene, ethylbenzene, ethyltoluene, and indene.

4. The method of claim 1, wherein the organic solvent is octane.

5. The method of claim 1, wherein the inert gas is selected from the group consisting of argon, nitrogen and helium.

6. The method of claim 1, wherein the introducing one or more highly reactive organometallic compounds to the reaction mixture is done with an injection rate of 1 ml/hour to avoid precipitation of the metal-containing nanocrystal cores.

7. The method of claim 1, wherein the time in step d) necessary to allow deposition of the one or more highly reactive organometallic compounds on the surface of the metal-containing nanocrystal cores is at least 5 minutes and maximum 15 minutes.

8. The method of claim 1, wherein the time in step f) necessary to obtain formation of a metal oxide on the surface of the metal-containing nanocrystal cores and thereby growth of a metal oxide shell on the surface of the metal-containing nanocrystal cores is at least 5 minutes and maximum 15 minutes.

9. The method of claim 1, wherein the optimal thickness of the metal oxide shell is from 1 nm to 20 nm.

10. The method of claim 1, further comprising recovering the core-shell nanocrystals from the reaction mixture.

11. The method of claim 1, wherein the fatty acid is selected from the group consisting of oleic acid, myristic acid, stearic acid, or a combination thereof, and wherein the long chain amine and phosphine oxide is selected from the group consisting of dodecylamine, oleylamine, trioctylphosphine, trioctylphospineoxide, and a combination thereof.

12. The method of claim 9, wherein the optimal thickness of the metal oxide shell is 1 nm to 6 nm.

13. The method of claim 1, wherein the C12-C18 long chain amine is dodecylamine, oleylamine or a combination thereof.

* * * * *